US010658044B2

(12) United States Patent
Lee

(10) Patent No.: US 10,658,044 B2
(45) Date of Patent: May 19, 2020

(54) SEMICONDUCTOR MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/170,854

(22) Filed: Oct. 25, 2018

(65) Prior Publication Data

US 2019/0272880 A1 Sep. 5, 2019

(30) Foreign Application Priority Data

Mar. 5, 2018 (KR) ........................ 10-2018-0025743

(51) Int. Cl.
| | | |
|---|---|---|
| *G11C 11/34* | (2006.01) | |
| *G11C 16/16* | (2006.01) | |
| *G11C 16/08* | (2006.01) | |
| *H01L 27/11582* | (2017.01) | |
| *G11C 16/04* | (2006.01) | |
| *H01L 27/11556* | (2017.01) | |
| *G11C 16/24* | (2006.01) | |
| *G11C 16/32* | (2006.01) | |

(52) U.S. Cl.
CPC .......... *G11C 16/16* (2013.01); *G11C 16/0483* (2013.01); *G11C 16/08* (2013.01); *G11C 16/24* (2013.01); *G11C 16/32* (2013.01); *H01L 27/11556* (2013.01); *H01L 27/11582* (2013.01)

(58) Field of Classification Search
CPC ..... G11C 16/16; G11C 16/0483; G11C 16/08; G11C 16/24; G11C 16/32; H01L 27/11556; H01L 27/11582

USPC ........................... 365/185.11, 185.29, 185.18
See application file for complete search history.

(56) References Cited

U.S. PATENT DOCUMENTS

| | | | | | |
|---|---|---|---|---|---|
| 5,473,563 A | * | 12/1995 | Suh | ......................... | G11C 16/16 |
| | | | | | 365/185.13 |
| 6,295,227 B1 | * | 9/2001 | Sakui | ....................... | G11C 8/14 |
| | | | | | 257/E27.103 |
| 6,330,189 B1 | * | 12/2001 | Sakui | .................. | G11C 16/3454 |
| | | | | | 365/185.17 |
| 9,472,292 B1 | * | 10/2016 | Lee | ......................... | G11C 16/12 |
| 9,514,828 B2 | * | 12/2016 | Shim | ...................... | G11C 16/24 |

(Continued)

FOREIGN PATENT DOCUMENTS

| | | |
|---|---|---|
| KR | 1020110038116 | 4/2011 |
| KR | 1020150135903 | 12/2015 |
| KR | 1020170052026 | 5/2017 |

*Primary Examiner* — Viet Q Nguyen
(74) *Attorney, Agent, or Firm* — IP & T Group LLP

(57) ABSTRACT

The semiconductor memory device includes a memory cell array, an address decoder, a switch, and a control logic. The memory cell array includes a plurality of memory blocks having a plurality of memory cells. The address decoder is connected to the memory cell array through row lines. The switch is connected non-memory lines among the row lines. The control logic controls operations of the address decoder and the switch. During an erase operation on memory cells included in a selected memory block among the plurality of memory blocks, the control logic controls the switch to precharge non-memory lines connected to an unselected memory block among the plurality of memory blocks and then float the non-memory lines connected to the unselected memory block.

18 Claims, 17 Drawing Sheets

(56) References Cited

U.S. PATENT DOCUMENTS

| | | | |
|---|---|---|---|
| 9,595,319 B2 * | 3/2017 | Lee | G11C 11/5635 |
| 9,715,934 B2 * | 7/2017 | Lee | G11C 11/5635 |
| 9,842,653 B2 * | 12/2017 | Lee | G11C 16/08 |
| 9,972,397 B2 * | 5/2018 | Lee | G11C 16/16 |
| 10,176,875 B2 * | 1/2019 | Lee | G11C 8/08 |
| 10,388,391 B2 * | 8/2019 | Lee | G11C 16/26 |
| 2002/0021587 A1 * | 2/2002 | Sakui | G11C 16/0433 |
| | | | 365/189.05 |
| 2007/0230253 A1 * | 10/2007 | Kim | G11C 8/08 |
| | | | 365/185.29 |
| 2008/0123411 A1 * | 5/2008 | Crippa | G11C 7/1021 |
| | | | 365/185.03 |
| 2012/0008419 A1 * | 1/2012 | Ha | G11C 16/0483 |
| | | | 365/185.25 |
| 2015/0003150 A1 * | 1/2015 | Aritome | G11C 16/3427 |
| | | | 365/185.02 |
| 2015/0179269 A1 * | 6/2015 | Lee | G11C 16/14 |
| | | | 365/185.03 |
| 2016/0314833 A1 * | 10/2016 | Lee | G11C 11/5635 |

* cited by examiner

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2018-0025743, filed on Mar. 5, 2018, the entire disclosure of which is herein incorporated herein by reference in its entirety.

BACKGROUND

1. Field of Invention

The present disclosure generally relates to an electronic device, and more particularly, to a semiconductor memory device and an operating method thereof.

2. Description of Related Art

Memory devices may be formed in a two-dimensional (2D) structure in which strings are arranged horizontally to a semiconductor substrate, or be formed in a three-dimensional (3D) structure in which strings are arranged vertically to a semiconductor substrate. A 3D semiconductor device has been devised to overcome the degree of integration limit in 2D semiconductor devices. The 3D semiconductor device may include a plurality of memory cells vertically stacked on a semiconductor substrate.

SUMMARY

Embodiments provide a semiconductor memory device having improved reliability and an operating method of the semiconductor device.

According to an aspect of the present disclosure, there is provided a semiconductor memory device including: a memory cell array including a plurality of memory blocks having a plurality of memory cells; an address decoder connected to the memory cell array through row lines; a switch connected to non-memory lines among the row lines; and a control logic configured to control operations of the address decoder and the switch, wherein, during an erase operation on memory cells in a selected memory block among the plurality of memory blocks, the control logic controls the switch to precharge non-memory lines connected to an unselected memory block among the plurality of memory blocks and then float the non-memory lines connected to the unselected memory block.

The control logic may control the address decoder to erase the selected memory block after the non-memory lines connected to the unselected memory block are floated.

The control logic may control the address decoder and the switch such that the non-memory lines are floated before the non-memory lines connected to the unselected memory block are precharged.

The row lines may include a drain select line, a source select line, and word lines. The non-memory lines may include the drain select line and the source select line.

The row lines may further include a pipe line. The non-memory lines may further include the pipe line.

The address decoder may include a plurality of block select circuits each connected to a corresponding memory block among the plurality of memory blocks through the row lines. The switch may include a plurality of switching circuits each connected to non-memory lines connected to a corresponding memory block among the plurality of memory blocks.

Each of the plurality of block select circuits may connect row lines connected to a corresponding memory block to global lines in response to a block select signal.

Each of the plurality of switching circuits may precharge corresponding non-memory lines by connecting the non-memory lines to a precharge power source in response to a control signal.

Each of the plurality of switching circuits may include a first transistor connected between a corresponding drain select line and the precharge power source, a second transistor connected between a corresponding source select line and the precharge power source, and a third transistor connected between a corresponding pipe line and the precharge power source.

At least one of the first transistor, the second transistor, and the third transistor may include an NMOS transistor.

At least one of the first transistor, the second transistor, and the third transistor may include a PMOS transistor.

According to another aspect of the present disclosure, there is provided a method for operating a semiconductor memory device including a plurality of memory blocks, the method including: precharging non-memory lines of an unselected memory block among the plurality of memory blocks; floating the non-memory lines of the unselected memory block; and applying an erase voltage to a selected memory block among the plurality of memory blocks.

The precharging of the non-memory lines of the unselected memory block may include: turning off a block select circuit connected to the unselected memory block; and connecting the non-memory lines of the unselected memory block to a precharge power source by turning on a switching circuit connected to the non-memory lines of the unselected memory block.

The floating of the non-memory lines of the unselected memory block may include: maintaining a turn-off state of the block select circuit connected to the unselected memory block; and turning off the switching circuit connected to the non-memory lines of the unselected memory block.

The applying of the erase voltage to the selected memory block among the plurality of memory blocks may include: applying an erase permission voltage to a word line connected to the selected memory block; and applying the erase voltage to a bulk area in which the selected memory block is formed.

The precharging of the non-memory lines of the unselected memory block may include connecting the non-memory lines of the unselected memory block to global non-memory lines by turning on the block select circuit connected to the unselected memory block.

The floating of the non-memory lines of the unselected memory block may include cutting off connection between the non-memory lines of the unselected memory block and the global non-memory lines by turning off the block select circuit connected to the unselected memory block.

According to an aspect of the present disclosure, there is provided a semiconductor memory device including: a memory cell array including a plurality of memory blocks; an address decoder configured to select at least one of the plurality of memory blocks; a plurality of row lines coupled between the address decoder and the plurality of memory blocks; a switch configured to selectively couple some row lines among the plurality of row lines to a power source; and a control logic configured to control the switch such that the some row lines connected to at least one unselected memory block are coupled to the power source to be precharged, and then floated.

The plurality of row lines may include a drain select line, a source select line, a pipe line and word lines. The some row lines may include the drain select line, the source select line and the pipe line.

During an erase operation on memory cells included in a selected memory block among the plurality of memory blocks, the control logic may control the switch such that the some row lines are coupled to the power source.

BRIEF DESCRIPTION OF THE DRAWINGS

Various embodiments will now be described more fully with reference to the accompanying drawings; however, elements and features of the embodiments may be configured or arranged differently than shown or described herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
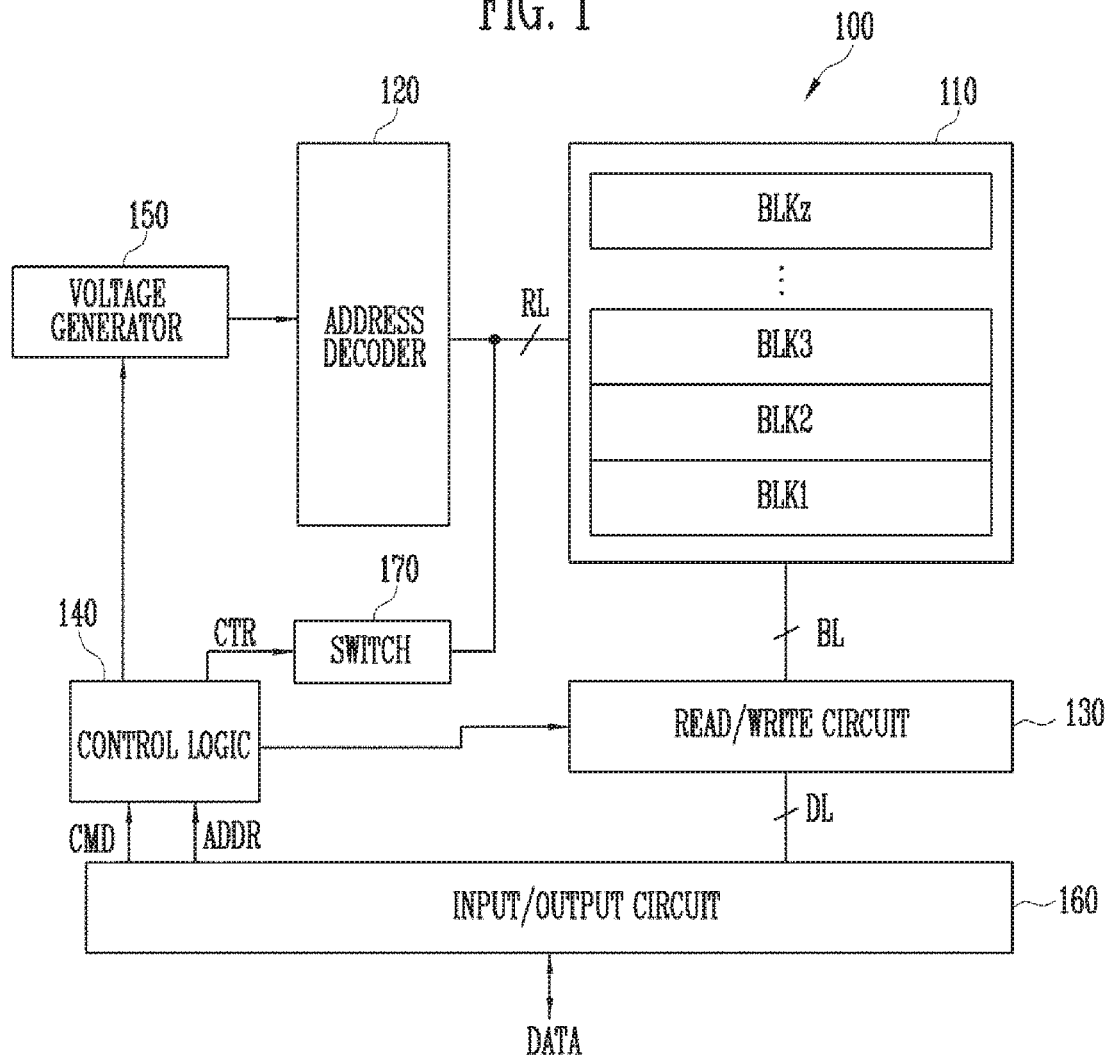
FIG. 1 is a block diagram illustrating a semiconductor memory device according to an embodiment of the present disclosure.

In the following detailed description, embodiments of the present disclosure are shown and described by way of example. As those skilled in the art would realize, the described embodiments may be modified in various different ways, all without departing from the spirit or scope of the present disclosure. Accordingly, the drawings and description are to be regarded as illustrative in nature and not restrictive. Also, throughout the specification, reference to "an embodiment" or the like is not necessarily to only one embodiment, and different references to "an embodiment" or the like are not necessarily to the same embodiment(s).

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include one or more other components rather than excluding such other component(s), unless the context indicates otherwise.

The same reference numerals are used to designate the same elements throughout drawings. Moreover, only elements, aspects and features necessary for understanding operations according to the embodiments may be described; description of known technical material may be omitted so as to not obscure important concepts of the embodiments.

FIG. 1 is a block diagram illustrating a semiconductor memory device 100 according to an embodiment of the present disclosure.

Referring to FIG. 1, the semiconductor memory device 100 may include a memory cell array 110, an address decoder 120, a read/write circuit 130, a control logic 140, a voltage generator 150, an input/output circuit 160, and a switch 170.

The memory cell array 110 may include a plurality of memory blocks BLK1 to BLKz. Each of the plurality of memory blocks BLK1 to BLKz may include a plurality of cell strings.

The plurality of memory blocks BLK1 to BLKz may be connected to the address decoder 120 through row lines RL. The plurality of memory blocks BLK1 to BLKz may be connected to the read/write circuit 130 through bit lines BL. Each of the plurality of memory blocks BLK1 to BLKz may include a plurality of memory cells. In an embodiment, the plurality of memory cells may be nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Each of the plurality of memory cells included in the memory cell array 110 may store at least one bit of data. In an embodiment, each of the plurality of memory cells included in the memory cell array 110 may be a single-level cell (SLC) that stores one bit of data. In another embodiment, each of the plurality of memory cells included in the memory cell array 110 may be a multi-level cell (MLC) that stores two bits of data. In still another embodiment, each of the plurality of memory cells included in the memory cell array 110 may be a triple-level cell that stores three bits of data. In still another embodiment, each of the plurality of memory cells included in the memory cell array 110 may be a quad-level cell that stores four bits of data. In some embodiments, the memory cell array 110 may include a plurality of memory cells that each stores five or more bits of data.

The address decoder 120 may be connected to the memory cell array 110 through the row lines RL. The row lines RL may include drain select lines, word lines, and source select lines. In an embodiment, the row lines RL may further include a pipe select line.

The address decoder 120 may operate under the control of the control logic 140. The address decoder 120 may receive an address ADDR from the control logic 140, and drive the row lines RL according to the received address ADDR.

In an embodiment, the address ADDR in a read operation may include a block address and a row address. The address decoder 120 may decode the block address in the received address ADDR. The address decoder 120 may select one memory block according to the decoded block address. The address decoder 120 may decode the row address in the received address ADDR. The address decoder 120 may apply a read voltage provided from the voltage generator 150 to a selected word line of a selected memory block according to the decoded row address, and apply a pass voltage provided from the voltage generator 150 to unselected word lines of the selected memory block.

The address decoder 120 may include a block decoder, a row decoder, an address buffer, and the like.

Read and program operations of the semiconductor memory device 100 may be performed in units of pages. An address received with a request of the read operation and/or the program operation may include a block address, a row address, and a column address. The address decoder 120 may select one memory block and one word line according to the block address and the row address. The column address may be decoded by the address decoder 120 to be provided to the read/write circuit 130.

The read/write circuit 130 may include a plurality of page buffers. The read/write circuit 130 may operate as a "read circuit" during a read operation of the memory cell array 110, and operate as a "write circuit" during a write operation of the memory cell array 110. The plurality of page buffers may be connected to the memory cell array 110 through the bit lines BL. In order to sense threshold voltages of memory cells during the read operation and the program verify operation, the plurality of page buffers may sense a change in amount of current flowing depending on a program state of a corresponding memory cell while continuously supplying sensing current to bit lines connected to the memory cells, and latch the sensed change as sensing data. The read/write circuit 130 may operate in response to page buffer control signals output from the control logic 140.

During the read operation, the read/write circuit 130 may temporarily store read data by sensing data of a memory cell and then output data DATA to the input/output circuit 160 of the semiconductor memory device 100. In an embodiment, the read/write circuit 130 may include a column select circuit, and the like, in addition to the page buffers (or page registers).

The control logic 140 may be connected to the address decoder 120, the read/write circuit 130, the voltage generator 150, the input/output circuit 160, and the switch 170. The control logic 140 may receive a command CMD and an address ADDR through the input/output circuit 160. The control logic 140 may control the overall operations of the semiconductor memory device 100.

The voltage generator 150 may generate operating voltages in response to a control signal output from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140. An erase voltage among the plurality of voltages generated by the voltage generator 150 may be applied to a bulk area of the memory cell array 110 to be transferred to a channel of memory cells of a selected memory block. Other some of the plurality of voltages may be transferred to the address decoder 120.

The input/output circuit 160 may transfer a command CMD and an address ADDR, which are received from an external source, to the control logic 140, transfer data DATA received from the read/write circuit 130 to the external source, or transfer data DATA received from the external source to the read/write circuit 130. To this end, the input/output circuit 160 may be connected to the read/write circuit 130 through data lines DL.

The address decoder 120, the read/write circuit 130, the voltage generator 150, and the input/output circuit 160 may serve as a "peripheral circuit" for performing read, write, and erase operations on the memory cell array 110. The peripheral circuit may perform the read, write, and erase operations on the memory cell array 110 under the control of the control logic 140.

The switch 170 may operate in response to a control signal CTR received from the control logic 140. More specifically, the switch 170 may perform a switching operation for precharging non-memory lines connected to an unselected memory block during an erase operation. To this end, the switch 170 may be connected to some of the row lines RL. For example, the switch 170 may be connected to non-memory lines among the row lines RL. The non-memory lines may include a source select line, a drain select line, and a pipe line.

Figure 2:
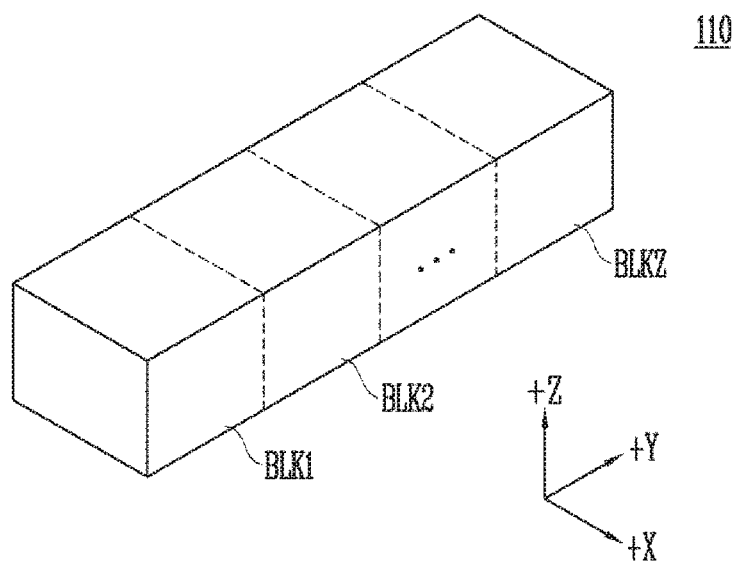
FIG. 2 is a block diagram illustrating an example of a memory cell array.

FIG. 2 is a block diagram illustrating an example of the memory cell array 110 of FIG. 1.

Referring to FIG. 2, the memory cell array 110 may include a plurality of memory blocks BLK1 to BLKz. Each memory block may have a three-dimensional structure. Each memory block may include a plurality of memory cells stacked above a substrate. The plurality of memory cells may be arranged along +X, +Y, and +Z directions. The structure of each memory block will be described in more detail with reference to FIGS. 3 and 4.

Figure 3:
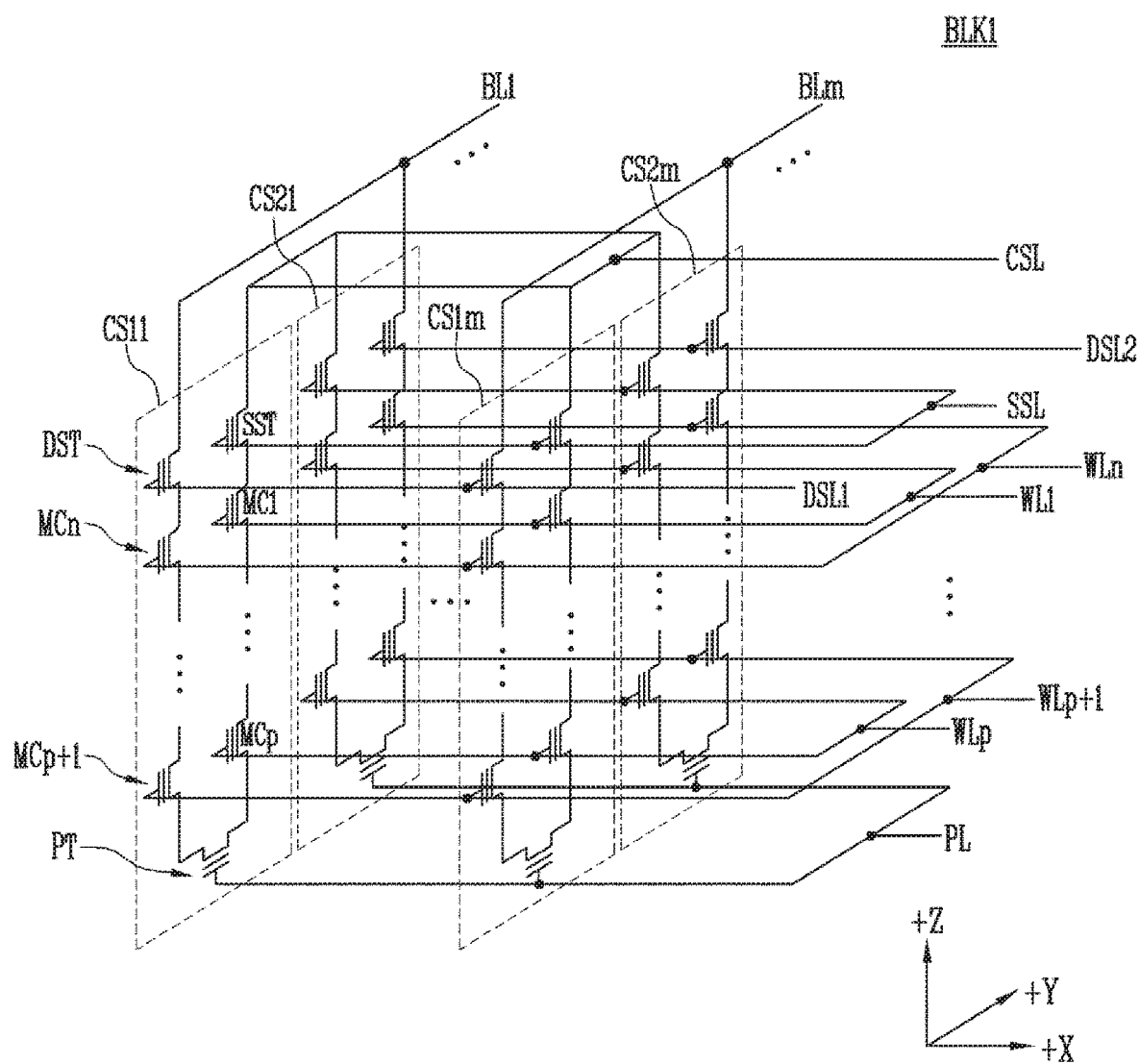
FIG. 3 is a circuit diagram illustrating an example of a memory block.

FIG. 3 is a circuit diagram illustrating an example of any one of the memory blocks BLK1 to BLKz of FIG. 2.

Referring to FIG. 3, a first memory block BLK1 may include a plurality of cell strings CS11 to CS1$m$ and CS21 to CS2$m$. In the first memory block BLK1, m cell strings may be arranged in a row direction (i.e., a +X direction). The m cell strings arranged in the row direction may be connected to first to mth bit lines BL1 to BLm, respectively. In addition, q (where q is a natural number) cell strings may be arranged in a column direction (i.e., a +Y direction). In FIG. 3, only two cell strings arranged in the column direction are illustrated for clarity; however, more than two cell strings may be so arranged.

Each of the plurality of cell strings CS11 to CS1m and CS21 to CS2m may be formed in a 'U' shape. Each of the plurality of cell strings CS11 to CS1m and CS21 to CS2m may include a pipe transistor PT, memory cells MC1 to MCn, a source select transistor SST, and a drain select transistor DST, which are stacked above a substrate (not shown) at a lower portion of the memory block BLK1.

The select transistors SST and DST and the memory cells MC1 to MCn may have structures similar to one another. For example, each of the select transistors SST and DST and the memory cells MC1 to MCn may include a channel layer, a tunneling insulating layer, a charge storage layer, and a blocking insulating layer connected to a corresponding row line.

The source select transistor SST of each cell string may be connected between a common source line CSL and memory cells MC1 to MCp. A gate of the source select transistor SST may be commonly connected to a source select line SSL.

First to nth memory cells MC1 to MCn of each cell string may be connected between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp and the (p+1)th to nth memory cells MCp+1 to MCn may be connected to each other through the pipe transistor PT. The first to pth memory cells MC1 to MCp may be sequentially arranged in the opposite direction of a +Z direction, and may be connected in series between the source select transistor SST and the pipe transistor PT. The (p+1)th to nth memory cells MCp+1 to MCn may be sequentially arranged in the +Z direction, and may be connected in series between the pipe transistor PT and the drain select transistor DST. Gates of the first to nth memory cells MC1 to MCn are connected to first to nth word lines WL1 to WLn, respectively.

A gate of the pipe transistor PT of each cell string may be connected to a pipe line PL.

The drain select transistor DST of each cell string may be connected between a corresponding bit line and the memory cells MCp+1 to MCn. The drain select transistors DST of cell strings CS11 to CS1m of a first row may be connected to a first drain select line DSL1. The drain select transistors DST of cell strings CS21 to CS2m of a second row may be connected to a second drain select line DSL2.

Consequently, cell strings (e.g., CS11 to CS1m) arranged on the same row (i.e., in the +X direction) may be connected to the same drain select line (e.g., DSL1) through corresponding drain select transistors. Cell strings (e.g., CS11 and CS21) arranged on different rows may be connected to different drain select lines DSL1 and DSL2.

Figure 4:
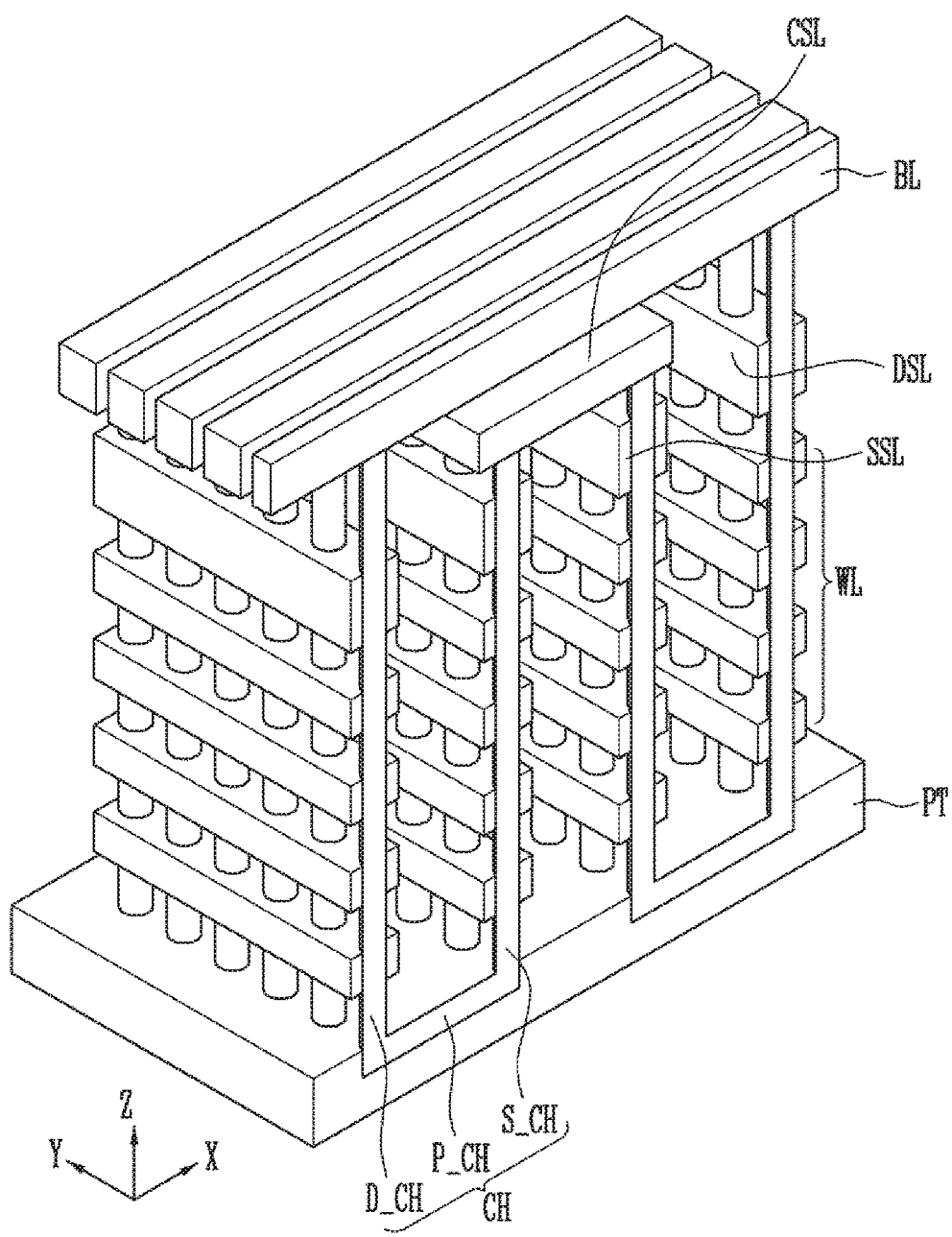
FIG. 4 is a perspective view illustrating a three-dimensional memory device.

FIG. 4 is a perspective view illustrating a three-dimensional memory device. For clarity, interlayer insulating layers are omitted from the illustration.

As shown in FIG. 4, the three-dimensional memory device may include a U-shaped channel layers CH that are arranged in a row direction (i.e., X direction) and a column direction (i.e., Y direction) and extend in a vertical direction (i.e., Z direction) with respect to a substrate. The U-shaped channel layer CH may include a pipe channel layer P_CH formed in a pipe transistor PT and a pair of a source-side channel layer S_CH and a drain-side channel layer D_CH, which are connected to the pipe channel layer P_CH.

In addition, the memory device may include word lines WL stacked along the source-side channel layer S_CH and the drain-side channel layer D_CH above the pipe transistor PT. A source select line SSL may be stacked above the word lines WL stacked along the source-side channel layer S_CH, and a drain select line DSL may be stacked above the word lines WL stacked along the drain-side channel layer D_CH.

According to the structure described above, memory cells may be stacked along the U-shaped channel layer CH, and a drain select transistor and a source select transistor may be respectively provided at both ends of the U-shaped channel layer CH. Thus, strings having a U shape are formed.

In addition, bit lines BL extending in the row direction (i.e., X direction) may be connected to the top of the drain-side channel layer D_CH, and a common source line CSL extending in the column direction (i.e., Y direction) may be connected to the top of the source-side channel layer S_CH.

In the three-dimensional memory device, the sizes of elements are small, and memory cells may be stacked in the vertical direction, as compared with the two-dimensional memory device. Hence, the three-dimensional memory device advantageously provides high integration. However, as the sizes of elements constituting the three-dimensional memory device decrease, the reliability of the three-dimensional memory device may be deteriorated even due to a minute change in electrical characteristic.

In a normal erase operation, while the erase operation is being performed, the voltage generator 150 may generate an erase voltage VER under the control of the control logic 140, and the address decoder 120 may apply the erase voltage VER generated by the voltage generator 150 to the common source line CSL of the memory cell array 110 under the control of the control logic 140. A source select transistor SST and a drain select transistor DST of a selected memory block may be controlled to be in a floating state.

After this, the potential level of a channel may be increased according to the potential level of the common source line CSL, and the potential levels of source select lines and drain select lines, which are connected to a plurality of source select transistors and drain select transistors in the floating state, may be increased due to a coupling phenomenon according to the potential level of the channel. Data stored in first to nth memory cells MC1 to MCn of a selected memory block may be erased by applying a voltage of 0 V to word lines WL of the selected memory block. That is, electrons stored in the charge storage layers of the first to nth memory cells MC1 to MCn may be detrapped by the potential of the channel due to the Fowler-Nordheim (FN) tunneling phenomenon.

In the case of an unselected memory block not to be erased, local word lines may be floated. In a structure of the memory cell array 110 in which a selected memory block and an unselected memory block share a source, when an erase voltage having a high voltage level is applied to the source of the selected memory block, a Gate Induced Drain Leakage (GIDL) phenomenon may occur due to a potential difference from non-memory lines in the floating state. Accordingly, when hot holes are introduced into the channel, the hot holes may be trapped at a channel bulk or interface even though they are not tunneled. Therefore, threshold voltages of memory cells of the unselected memory block may be shifted, which results in deterioration of the reliability of the semiconductor memory device in the read operation.

In the semiconductor memory device 100 according to an embodiment of the present disclosure, non-memory lines connected to an unselected memory block may be precharged before an erase voltage is applied during an erase operation. The potentials of the non-memory lines connected to the unselected memory block may be increased by the precharging, and the non-memory lines may be then floated. After this, when the erase voltage is applied to the source of the unselected memory block, the potential levels of the floated non-memory lines due to the coupling phenomenon may be increased. Thus, it is less likely that the GIDL phenomenon will occur, and any hot hole is not generated. Consequently, threshold voltages of memory cells included in the unselected memory block may be maintained, and the reliability of the semiconductor memory device may be improved.

Figure 5:
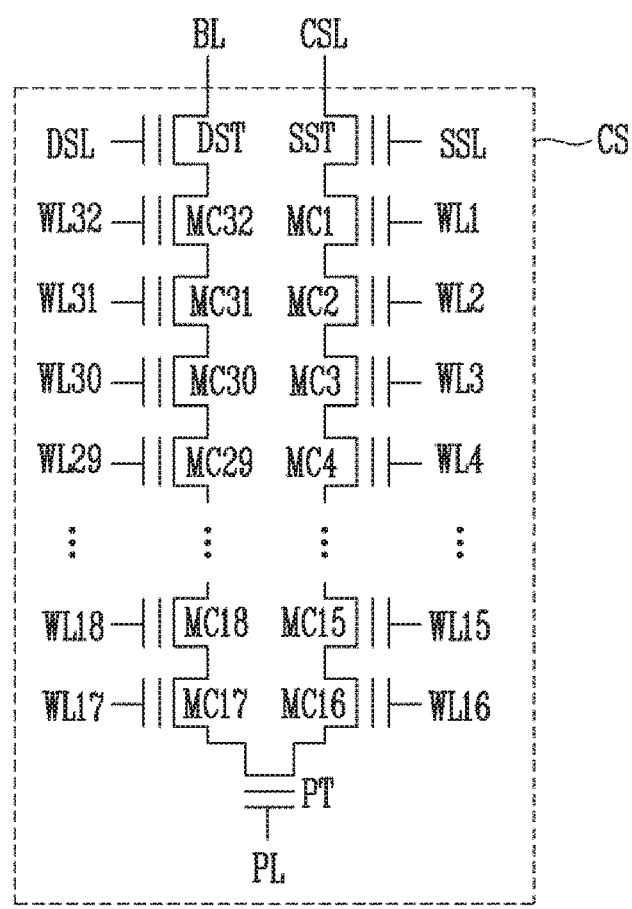
FIG. 5 is a diagram illustrating a structure of a cell string included in a memory block of FIG. 3.

FIG. 5 is a diagram illustrating a structure of a cell string included in the memory block BLK1 of FIG. 3.

Referring to FIG. 5, the cell string CS may include a drain select transistor DST connected to a bit line BL, a source select transistor SST connected to a common source line CSL, and a pipe transistor PT. Also, the cell string CS may include memory cells MC1 to MC16 connected between the source select transistor SST and the pipe transistor PT, and memory cells MC17 to MC32 connected between the drain select transistor DST and the pipe transistor PT. In the example of FIG. 5, one cell string CS includes 32 memory cells MC1 to MC32. However, the number of memory cells included in the cell string may be different depending on design.

In the semiconductor memory device 100 according to an embodiment of the present disclosure, non-memory lines connected to an unselected memory block may be precharged before an erase voltage is applied. More specifically, the voltage level of a drain select line DSL, a source select line SSL, and a pipe line PL, which are connected to the unselected memory block, may be increased, and the drain select line DSL, the source select line SSL, and the pipe line PL then may be floated. After this, an erase voltage for erasing a selected memory block may be applied. Accordingly, the voltage level of the non-memory lines connected to the unselected memory block, i.e., the drain select line DSL, the source select line SSL, and the pipe line PL may be sufficiently increased, and hence the GIDL phenomenon does not occur. Consequently, threshold voltages of memory cells in the unselected memory block may be maintained, and the reliability of the semiconductor memory device may be improved.

Figure 6:
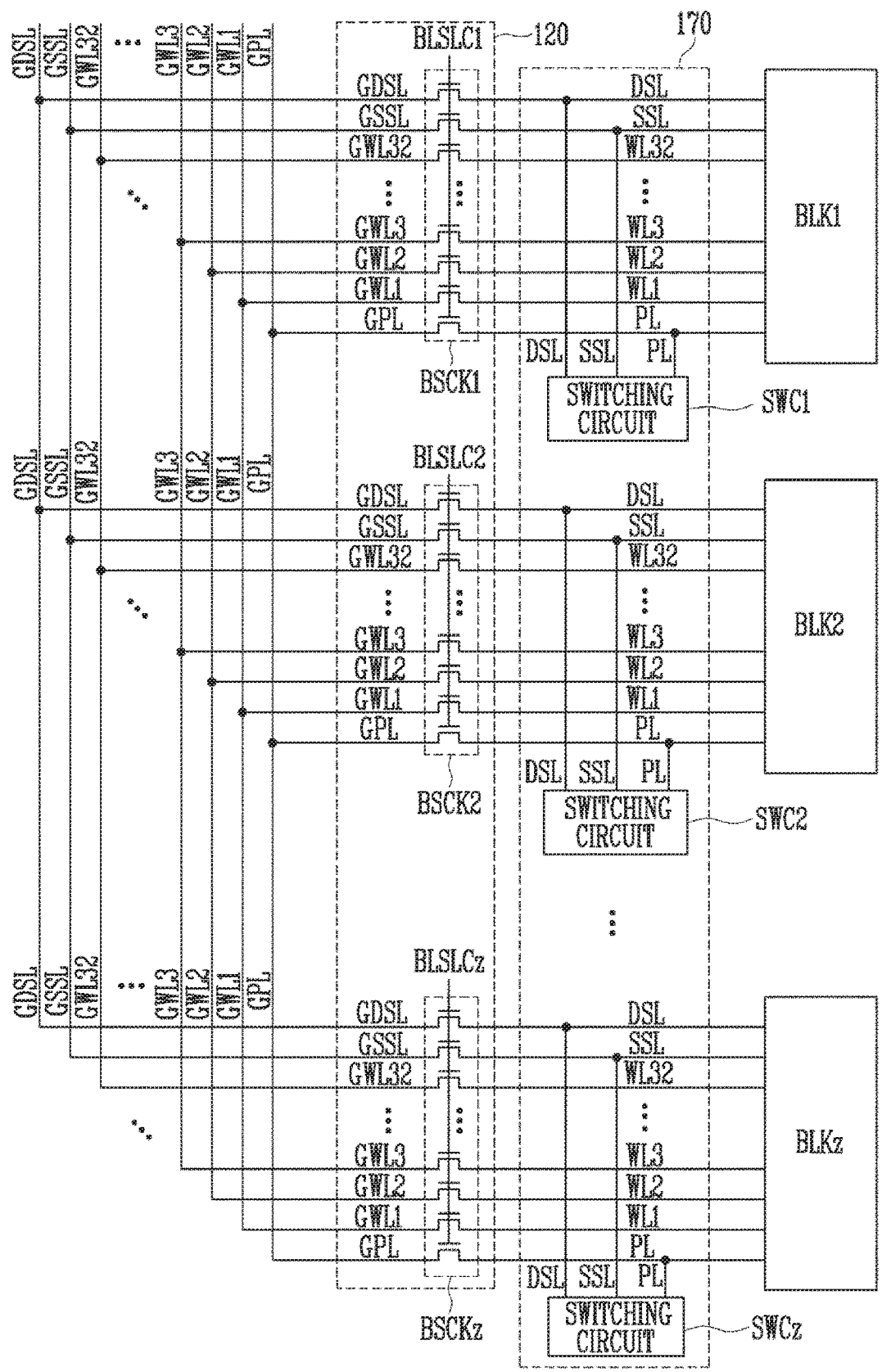
FIG. 6 is a block diagram illustrating an address decoder and a switch of a semiconductor memory device according to an embodiment of the present disclosure.

FIG. 6 is a block diagram illustrating examples of the address decoder 120 and the switch 170 of a semiconductor memory device.

Referring to FIG. 6, global lines GL may include a global drain select line GDSL, a global source select line GSSL, global word lines GWL1 to GWL32, and a global pipe line GPL. Voltages having various levels, which are generated by the voltage generator 150 of FIG. 1, are transferred to the global lines GL.

The address decoder 120 may include block select circuits BSCK1 to BSCKz. The switch 170 may include switching circuits SWC1 to SWCz. The block select circuits BSCK1 to BSCKz may be connected to corresponding memory blocks BLK1 to BLKz, respectively. The switching circuits SWC1 to SWCz may be connected to the memory blocks BLK1 to BLKz, respectively.

The address decoder 120 may transfer voltages applied to the global lines GL to local lines DSL, SSL, WL1 to WL32, and PL of a selected memory block in response to a block select signal BLSLC1 to BLSLCz.

Specifically, each of the block select circuits BSCK1 to BSCKz included in the address decoder 120 may connect the global lines GL and the local lines DSL, SSL, WL1 to WL32, and PL in response to the block select signal BLSLC1 to BLSLCz such that voltages applied to the global lines GL are transferred to the local lines DSL, SSL, WL1 to WL32, and PL.

For example, when z (where z is a positive integer) memory blocks are included in the memory cell array 110, the address decoder 120 may include z block select circuits BSCK1 to BSCKz. In an erase operation, a block select circuit connected to a selected memory block to be erased may be turned on, so that between the global lines GL and the local lines DSL, SSL, WL1 to WL32, and PL are connected. A block select circuit connected to an unselected memory block not to be erased may be turned off.

When any of memory blocks BLK1 to BLKz is an unselected memory block, the corresponding switching circuit may precharge non-memory lines, i.e., a drain select line DSL, a source select line SSL, and a pipe line PL, which are connected to the unselected memory block, during a precharge period before an erase voltage is applied. To this end, each of the switching circuits SWC1 to SWCz may be connected to the drain select line DSL, the source select line SSL, and the pipe line PL, which are connected to the corresponding memory block BLK1 to BLKz.

Figure 7:
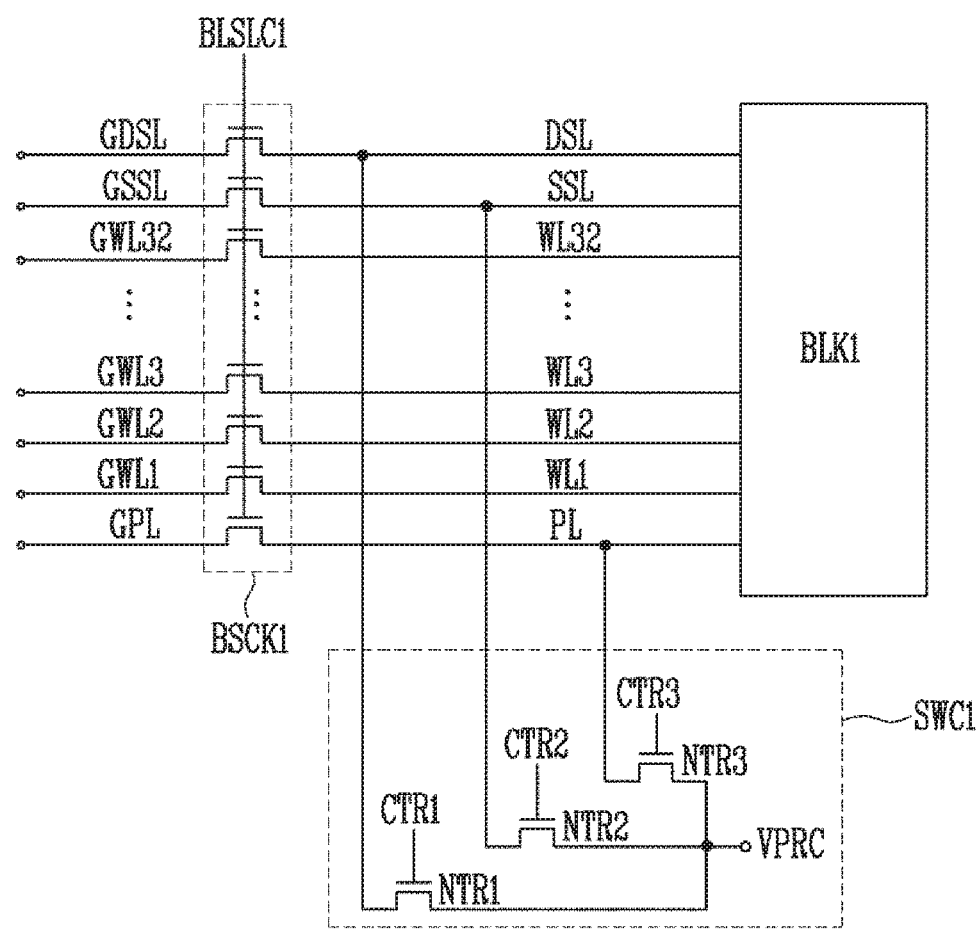
FIG. 7 is a block diagram illustrating an example of a switching circuit of a semiconductor memory device according to an embodiment of the present disclosure.

FIG. 7 is a block diagram illustrating an example of a switching circuit of a semiconductor memory device according to an embodiment of the present disclosure, for example, the switching circuit SWC1 of the semiconductor memory device in FIG. 6.

Referring to FIG. 7, by way of example, it is illustrated that the switching circuit SWC1 and a block select circuit BSCK1 are connected to one memory block BLK1. The configuration of the block select circuit BSCK may be the same as described in FIG. 6. The switching circuit SWC1 may include NMOS transistors NTR1, NTR2, and NTR3 respectively connected to the drain select line DSL, the source select line SSL, and the pipe line PL. A first NMOS transistor NTR1 may be connected between the drain select line DSL and a precharge power source VPRC. A second NMOS transistor NTR2 may be connected between the source select line SSL and the precharge power source VPRC. A third NMOS transistor NTR3 may be connected between the pipe line PL and the precharge power source VPRC. The precharge power source VPRC may supply a positive voltage, and supply a voltage for precharging the non-memory lines, i.e., the drain select line DSL, the source select line SSL, and the pipe line PL, which are connected to an unselected memory block.

First to third control signals CTR1, CTR2, and CTR3 may be applied to gate terminals of the first to third NMOS transistors NTR1, NTR2, and NTR3, respectively. The first to third NMOS transistors NTR1, NTR2, and NTR3 may be turned on or turned off according to the first to third control signals CTR1, CTR2, and CTR3, respectively. When the first to third NMOS transistors NTR1, NTR2, and NTR3 are turned on, the drain select line DSL, the source select line SSL, and the pipe line PL may be connected to the precharge power source VPRC. When the first to third NMOS transistors NTR1, NTR2, and NTR3 are turned off, the drain select line DSL, the source select line SSL, and the pipe line PL may not be connected to the precharge power source VPRC.

Figure 8:
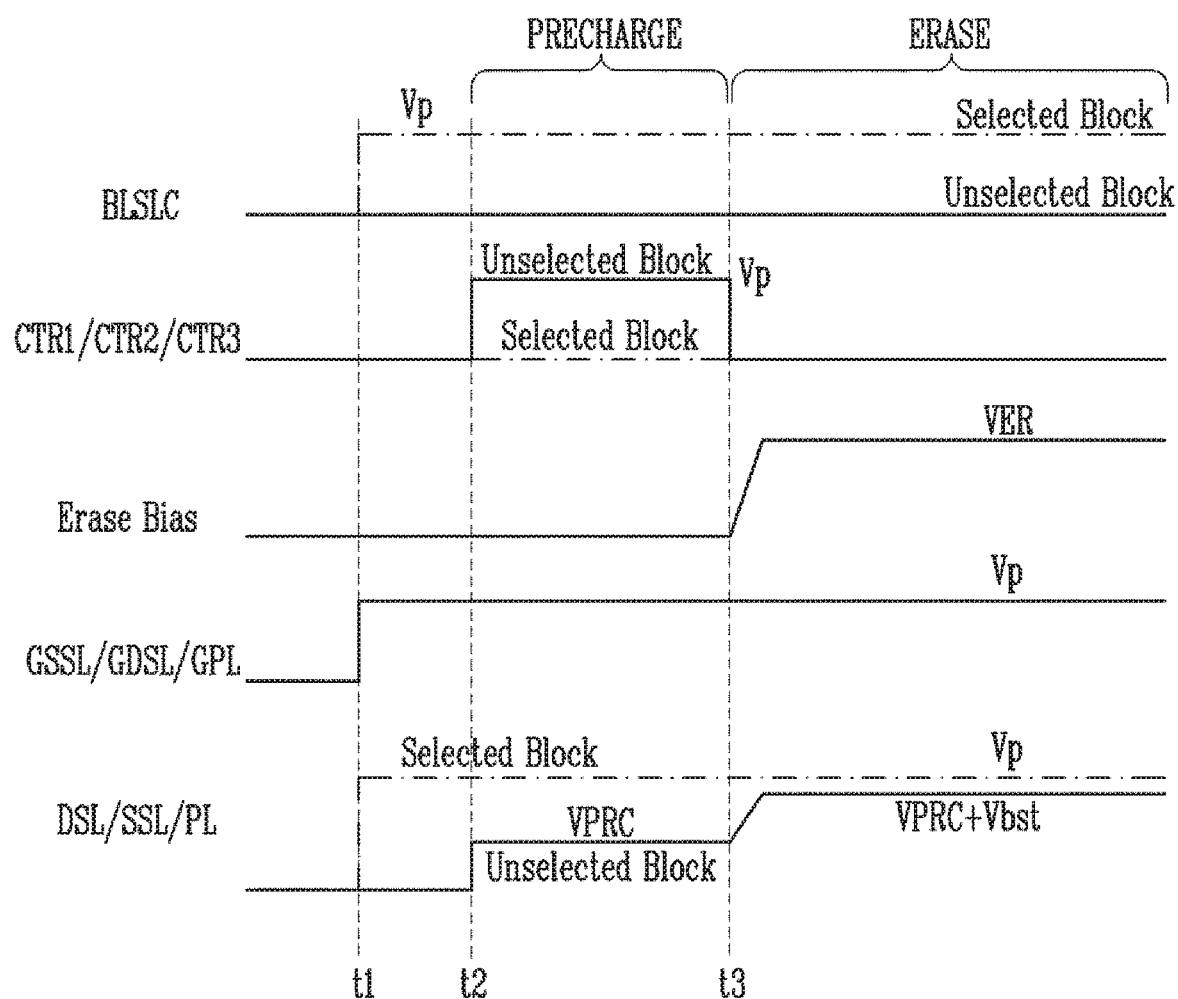
FIG. 8 is a timing diagram illustrating an operation of a semiconductor memory device according to an embodiment of the present disclosure.

FIG. 8 is a timing diagram illustrating an operation of a semiconductor memory device according to an embodiment of the present disclosure, for example, operation of the semiconductor memory device 100 in FIG. 7.

Referring to FIG. 8, first, at a time t1, the voltage level of a block select signal BLSLC corresponding to a selected memory block (Selected Block) is increased to a pass voltage Vp. The pass voltage Vp is a voltage at which transistors in the corresponding block select circuit can be turned on. Accordingly, a block select circuit BSCK corresponding to the selected memory block is turned on. Thus, row lines RL connected to the selected memory block are connected to global lines GL.

At the time t1, the pass voltage Vp is applied to global non-memory lines GDSL, GSSL, and GPL among the global lines GL. Thus, at the time t1, the voltage level of non-memory lines DSL, SSL, and PL connected to the selected memory block is also increased to the pass voltage Vp.

At the time t1, the voltage level of a block select signal BLSLC corresponding to an unselected memory block (Unselected Block) is low. Thus, a block select circuit BSCK connected to the unselected memory block is in a turn-off state. Accordingly, the floating state of a drain select line DSL, a source select line SSL, and a pipe line PL, which are connected to the unselected memory block, may be maintained until a time t2.

At the time t2, control signals CTR1, CTR2, and CTR3 applied to a switching circuit SWC connected to the unselected memory block are activated to the pass voltage Vp. Accordingly, the switching circuit SWC connected to the unselected memory block is turned on. More specifically, as shown in FIG. 7, the first to third NMOS transistors NTR1, NTR2, and NTR3 in the switching circuit SWC1 connected to the unselected memory block are turned on. Accordingly, non-memory lines, i.e., the drain select line DSL, the source select line SSL, and the pipe line PL, which are connected to the unselected memory block, are connected to the precharge power source VPRC. Thus, after the time t2, the voltage level of the drain select line DSL, the source select line SSL, and the pipe line PL, which are connected to the unselected memory block, is also increased to the voltage level of the precharge power source VPRC.

At the time t2, the voltage of the control signals CTR1, CTR2, and CTR3 applied to the switching circuit SWC connected to the selected memory block maintains a low level.

After this, at a time t3, the control signals CTR1, CTR2, and CTR3 applied to the switching circuit SWC connected to the unselected memory block are deactivated. Accordingly, the switching circuit SWC connected to the unselected memory block is turned off. More specifically, as shown in FIG. 7, the first to third NMOS transistors NTR1, NTR2, and NTR3 in the switching circuit SWC1 connected to the unselected memory block are turned off. Accordingly, the non-memory lines, i.e., the drain select line DSL, the source select line SSL, and the pipe line PL, which are connected to the unselected memory block, are floated.

At the time t3, the voltage level of an erase bias (Erase Bias) applied to the selected memory block is increased to an erase voltage VER. As described above, the erase bias is applied to the bulk area. Thus, at the same time when the channel potential of the selected memory block is increased, the voltage of the non-memory lines connected to the unselected memory block is increased due to the coupling phenomenon. Accordingly, at the time t3, the voltage level of the drain select line DSL, the source select line SSL, and the pipe line PL, which are connected to the unselected memory block, is increased by a boosting voltage Vbst from the voltage of the precharge power source VPRC.

As shown in FIG. 8, the semiconductor memory device 100 according to an embodiment of the present disclosure precharges the voltage level of the non-memory lines connected to the unselected memory block during a precharge period (PRECHARGE) defined by the times t2 and t3. After this, at the time t3, the non-memory lines connected to the unselected memory block are floated, and the erase voltage VER is applied during an erase period ERASE after the time t3. Accordingly, the voltage level of the non-memory lines connected to the unselected memory block is again increased due to the coupling phenomenon in the erase period ERASE. Consequently, the voltage level of the non-memory lines connected to the unselected memory block is increased to a voltage {VPRC+Vbst} in the erase period ERASE. Thus, it is less likely that the GIDL phenomenon will occur, and hence less likely that any hot hole is generated. Consequently, threshold voltages of memory cells in the unselected memory block may be maintained, and the reliability of the semiconductor memory device may be improved.

Figure 9:
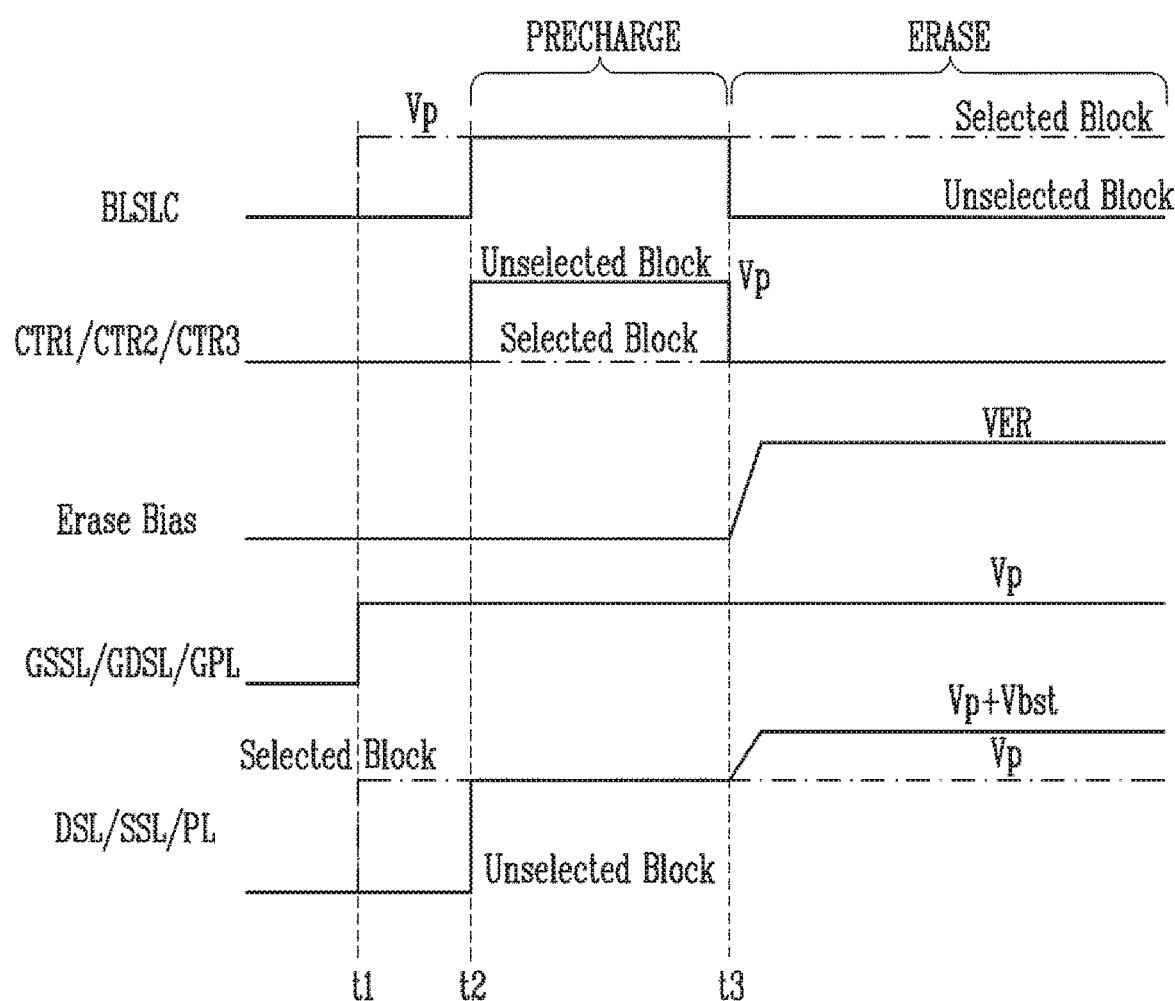
FIG. 9 is a timing diagram illustrating an operation of a semiconductor memory device according to another embodiment of the present disclosure.

FIG. 9 is a timing diagram illustrating another operation of a semiconductor memory device according to another embodiment of the present disclosure. In FIG. 9, bias conditions of the control signals CTR1, CTR2, and CTR3 for controlling the switching, the erase bias (Erase Bias), and the global non-memory lines GDSL, GSSL, and GPL are the same as described in FIG. 8. Also, bias conditions of the block select signal (BLSLC) corresponding to the selected memory block (Selected Block) are also the same as described in FIG. 8.

Referring to FIG. 9, the voltage level of the block select signal BLSLC corresponding to the unselected memory block (Unselected Block) is increased to the pass voltage Vp during the precharge period (PRECHARGE), which is from t2 to t3. Accordingly, the non-memory lines DSL, SSL, and PL of the unselected memory block are connected to the global non-memory lines GSSL, GDSL, and GPL, respectively. Thus, the voltage level of the non-memory lines DSL, SSL, and PL of the unselected memory block is increased to the pass voltage Vp during the precharge period. FIG. 9 illustrates that the voltage level of the control signals CTR1, CTR2, and CTR3 corresponding to the unselected memory block is increased to the pass voltage Vp during the precharge period. Thus, according to the embodiment of FIG. 9, it can be seen that a precharge operation on the non-memory lines DSL, SSL, and PL of the unselected memory block is performed by the block select circuit BSCK and is also performed by the switching circuit SWC. The voltage of the precharge power source VPRC, which is supplied by the switching circuit SWC, may have the same voltage level as the pass voltage Vp.

Alternatively, the voltage level of the control signals CTR1, CTR2, and CTR3 corresponding to the unselected memory block may maintain the low level during the precharge period. The precharge operation on the non-memory lines DSL, SSL, and PL of the unselected memory block is performed by the block select circuit BSCK.

At the time t3, the control signals CTR1, CTR2, and CTR3 applied to the switching circuit SWC connected to the unselected memory block are deactivated. Also, at the time t3, the voltage level of the block select signal BLSLC corresponding to the unselected memory block Unselected Block is deactivated to the low level. Accordingly, the non-memory lines DSL, SSL, and PL of the unselected memory block are floated.

In addition, at the time t3, the voltage level of the erase bias Erase Bias applied to the selected memory block is increased to the erase voltage VER. As described above, the erase bias is applied to the bulk area. Thus, at the same time when the channel potential of the selected memory block is increased, the voltage of the non-memory lines connected to the unselected memory block is increased due to the coupling phenomenon. Accordingly, at the time t3, the voltage level of the drain select line DSL, the source select line SSL, and the pipe line PL, which are connected to the unselected memory block, is increased by the boosting voltage Vbst from the pass voltage Vp. Consequently, the voltage level of the non-memory lines connected to the unselected memory block is increased to a voltage {Vp+Vbst}.

Figure 10:
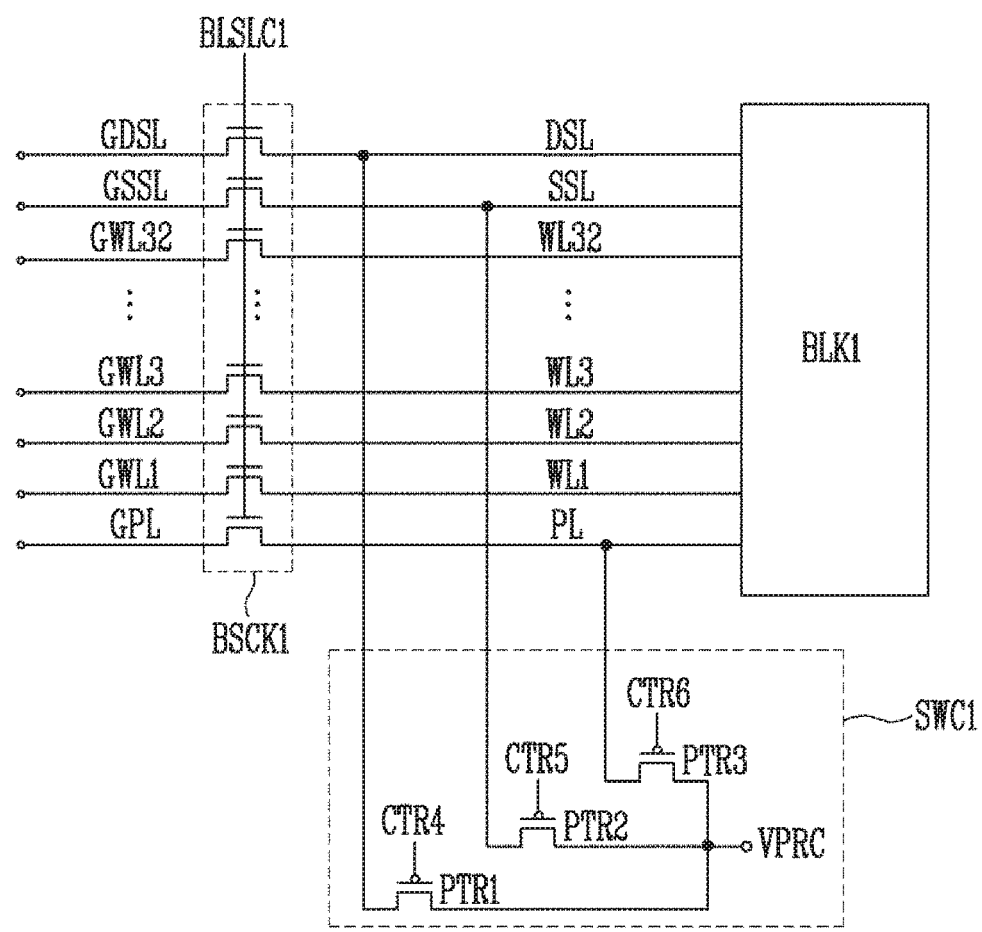
FIG. 10 is a block diagram illustrating a switching circuit of a semiconductor memory device according to an embodiment of the present disclosure.

FIG. 10 is a block diagram illustrating another embodiment of a switching circuit of the semiconductor memory device, for example, the switching circuit SWC1 of the semiconductor memory device in FIG. 6.

Referring to FIG. 10, by way of example, it is illustrated that the switching circuit SWC1 and a block select circuit BSCK1 are connected to one memory block BLK1. The configuration of the block select circuit BSCK may be the same as that described in FIG. 6. The switching circuit SWC1 may include PMOS transistors PTR1, PTR2, and PTR3 respectively connected to the drain select line DSL, the source select line SSL, and the pipe line PL. A first PMOS transistor PTR1 may be connected between the drain select line DSL and a precharge power source VPRC. A second PMOS transistor PTR2 may be connected between the source select line SSL and the precharge power source VPRC. A third PMOS transistor PTR3 may be connected between the pipe line PL and the precharge power source VPRC. The precharge power source VPRC may supply a positive voltage, and supply a voltage for precharging the non-memory lines, i.e., the drain select line DSL, the source select line SSL, and the pipe line PL, which are connected to an unselected memory block.

Fourth to sixth control signals CTR4, CTR5, and CTR6 may be applied to gate terminals of the first to third PMOS transistors PTR1, PTR2, and PTR3, respectively. The first to third PMOS transistors PTR1, PTR2, and PTR3 may be turned on or turned off according to the fourth to sixth control signals CTR4, CTR5, and CTR6, respectively. When the first to third PMOS transistors PTR1, PTR2, and PTR3 are turned on, the drain select line DSL, the source select line SSL, and the pipe line PL may be connected to the precharge power source VPRC. When the first to third PMOS transistors PTR1, PTR2, and PTR3 are turned off, the drain select line DSL, the source select line SSL, and the pipe line PL may be not connected to the precharge power source VPRC.

Figure 11:
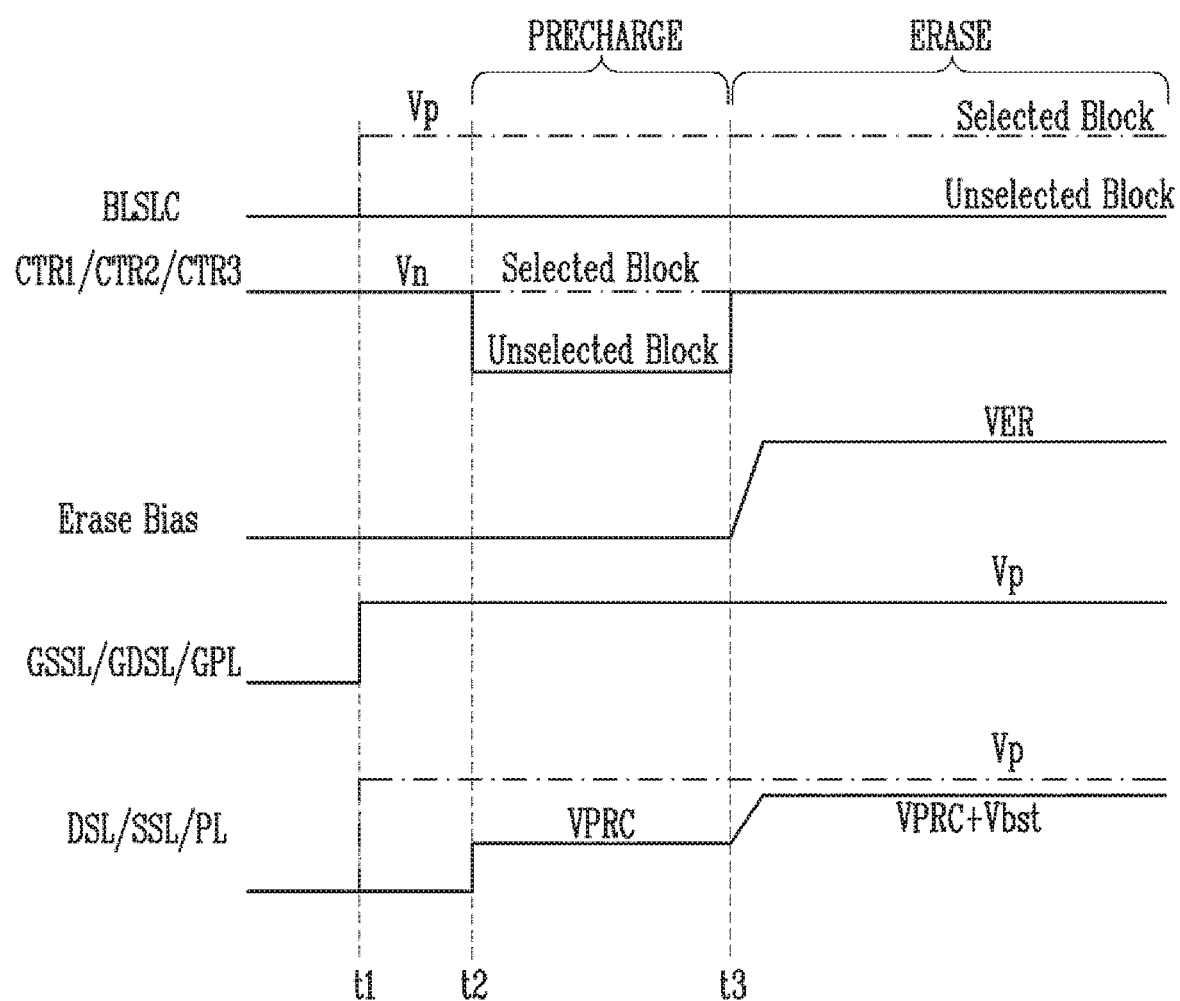
FIG. 11 is a timing diagram illustrating an operation of a semiconductor memory device according to an embodiment of the present disclosure.

FIG. 11 is a timing diagram illustrating an operation of a semiconductor memory device according to an embodiment of the present disclosure.

Referring to FIG. 11, bias conditions of the block select signal BLSLC, the erase bias Erase Bias, and the global non-memory lines GDSL, GSSL, and GPL are the same as the embodiment shown in FIG. 8. However, the PMOS transistor is used rather than the NMOS transistor in the switching circuit SWC1 of FIG. 10, and hence bias conditions of the control signals CTR4, CTR5, and CTR6 of FIG. 11 are different from those of the control signals CTRL CTR2, and CTR3 of FIG. 10.

Before the precharge period PRECHARGE, the control signals CTR4, CTR5, and CTR6 of an unselected memory block and a selected memory block maintain a voltage Vn having a high level. The voltage Vn is a voltage at which the first to third PMOS transistors PTR1, PTR2, and PTR3 can be turned off. Accordingly, the first to third PMOS transistors PTR1, PTR2, and PTR3 are turned off before the precharge period PRECHARGE.

During the precharge period PRECHARGE, the control signals CTR4, CTR5, and CTR6 of the unselected memory block are activated to the low level. Accordingly, the first to third PMOS transistors PTR1, PTR2, and PTR3 of the switching circuit SWC1 connected to the unselected memory block are turned on during the precharge period PRECHARGE. Thus, the voltage level of the non-memory lines DSL, SSL, and PL connected to the unselected memory block is increased to the voltage of the precharge power source VPRC.

After this, at the time t3, the control signals CTR4, CTR5, and CTR6 of the unselected memory block is deactivated to the high level. Accordingly, the non-memory lines DSL, SSL, and PL connected to the unselected memory block are floated.

At the time t3, the voltage level of the erase bias (Erase Bias) applied to the selected memory block is increased to the erase voltage VER. As described above, the erase bias (Erase Bias) is applied to the bulk area. Thus, at the same time when the channel potential of the selected memory block is increased, the voltage of the non-memory lines connected to the unselected memory block is increased due to the coupling phenomenon. Accordingly, at the time t3, the voltage level of the drain select line DSL, the source select line SSL, and the pipe line PL, which are connected to the unselected memory block, is increased by a boosting voltage Vbst from the voltage of the precharge power source VPRC, i.e., {VPRC+Vbst}.

Consequently, threshold voltages of memory cells included in the unselected memory block are maintained, and the reliability of the semiconductor memory device may be improved.

Figure 12:
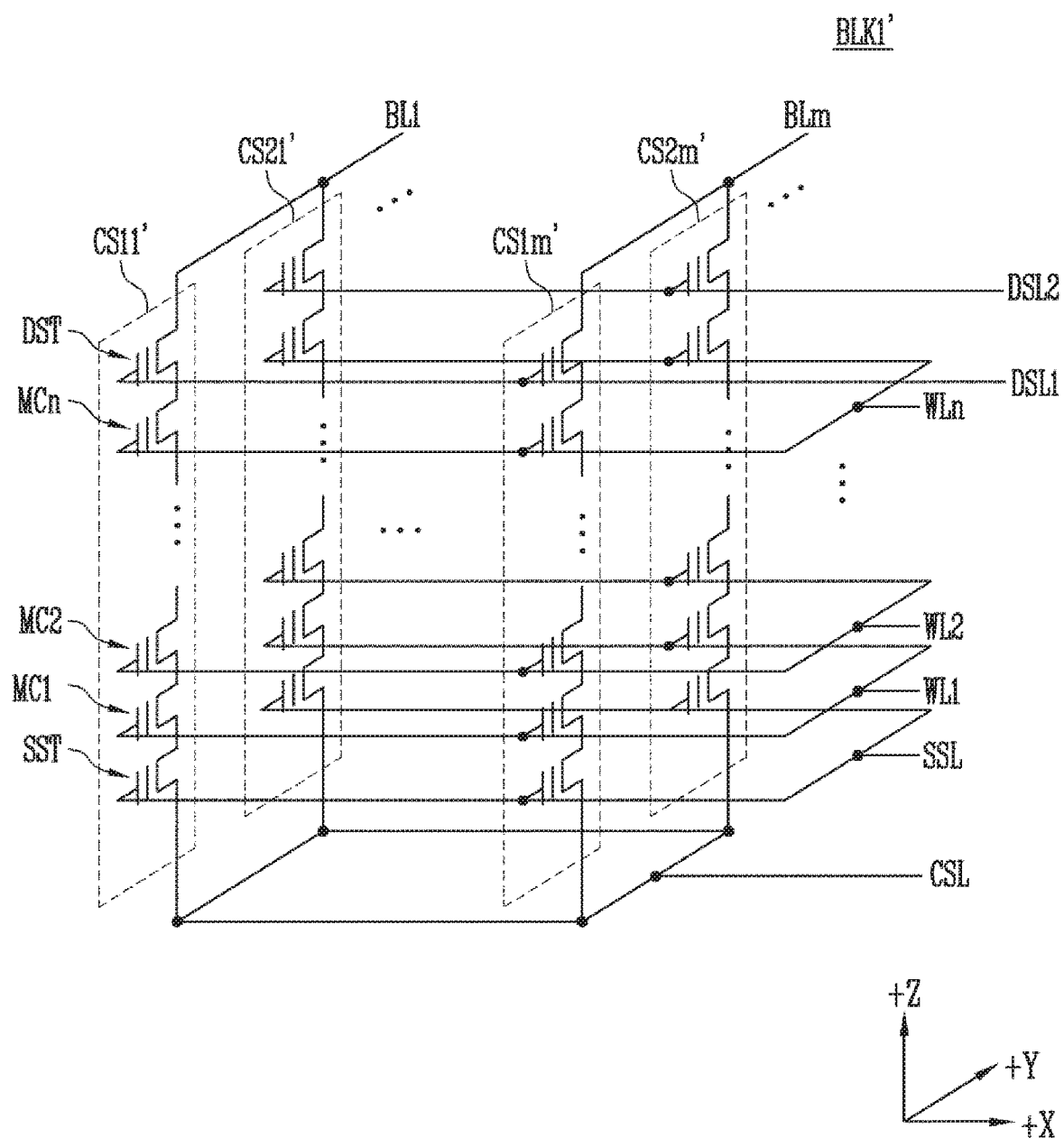
FIG. 12 is a circuit diagram illustrating another embodiment of a memory block.

FIG. 12 is a circuit diagram illustrating another embodiment BLK1' of one of the memory blocks BLK1 to BLKz of FIG. 2.

Referring to FIG. 12, a first memory block BLK1' may include a plurality of cell strings CS11' to CS1m' and CS21' to CS2m'. In the first memory block BLK1', m cell strings may be arranged in a row direction (i.e., a +X direction). The m cell strings arranged in the row direction may be connected to first to mth bit lines BL1 to BLm, respectively. In addition, q (where q is a natural number) cell strings may be arranged in a column direction (i.e., a +Y direction). In FIG. 12, only two cell strings arranged in the column direction are illustrated for clarity; however, more than two cell strings may be so arranged.

Each of the plurality of cell strings CS11' to CS1m' and CS21' to CS2m' may extend along a +Z direction. Each of the plurality of cell strings CS11' to CS1m' and CS21' to CS2m' may include a source select transistor SST, first to nth memory cells MC1 to MCn, and a drain select transistor DST, which are stacked above a substrate (not shown) at a lower portion of the memory block BLK1'.

The source select transistor SST of each cell string may be commonly connected to a common source line CSL. The source select transistor SST of each cell string may be connected between the common source line CSL and the memory cells MC1 to MCn. A gate of the source select transistor SST of each cell string may be connected to a source select line SSL.

The first to nth memory cells MC1 to MCn of each cell string may be connected in series between the source select transistor SST and the drain select transistor DST. Memory cells arranged at the same height may be connected to the same word line. The first to nth memory cells MC1 to MCn may be connected to first to nth word lines WL1 to WLn, respectively.

The drain select transistor DST of each cell string may be connected between a corresponding bit line and the memory cells MC1 to MCn. The drain select transistors of cell strings arranged on the same row (i.e., in the +X direction) may be connected to the same drain select line. The drain select transistors DST of cell strings CS11' to CS1m' of a first row may be connected to a first drain select line DSL1. The drain select transistors DST of cell strings CS21' to CS2m' of a second row may be connected to a second drain select line DSL2.

Consequently, the memory block BLK1' of FIG. 12 has a circuit similar to that of the memory block BLK1 of FIG. 3, except that the pipe transistor PT is excluded from each cell string.

In FIG. 12, first to mth cell strings CS11' to CS1m' or CS21' to CS2m' arranged in the row direction may be connected to the first to mth bit lines BL1 to BLm, respectively. In another embodiment, even bit lines and odd bit lines may be provided instead of the first to mth bit lines BL1 to BLm. In addition, it will be understood that, among the cell strings CS11' to CS1m' or CS21' to CS2m' arranged in the row direction, even-numbered cell strings may be respectively connected to the even bit lines and odd-numbered cell strings may be respectively connected to the odd bit lines.

Figure 13:
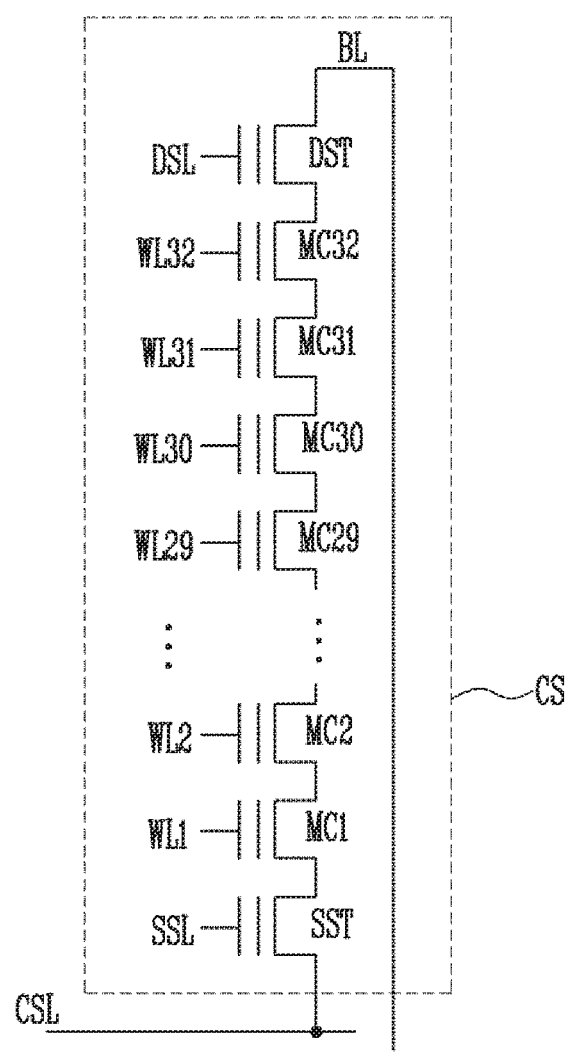
FIG. 13 is a diagram illustrating a structure of a cell string included in a memory block of FIG. 12.

FIG. 13 is a diagram illustrating a structure of the cell string included in the memory block BLK1' of FIG. 12.

Referring to FIG. 13, the cell string CS may include a drain select transistor DST connected to a bit line BL and a source select transistor SST connected to a common source line CSL. Also, the cell string CS may include memory cells MC1 to MC32 connected between the source select transistor SST and the drain select transistor DST. In the example of FIG. 13, one cell string CS may include 32 memory cells MC1 to MC32. However, the number of memory cells included in the cell string may vary depending on design. As compared with the cell string of FIG. 5, the cell string of FIG. 13 does not include the pipe transistor PT.

In the semiconductor memory device 100 according to an embodiment of the present disclosure, non-memory lines connected to an unselected memory block may be precharged before an erase voltage is applied. More specifically, the voltage level of a drain select line DSL and a source select line SSL, which are connected to the unselected memory block, may be increased, and the drain select line DSL and the source select line SSL may be then floated. After this, an erase voltage for erasing a selected memory block may be applied. Accordingly, the voltage level of the non-memory lines connected to the unselected memory block, i.e., the drain select line DSL and the source select line SSL may be sufficiently increased, and hence the GIDL phenomenon may not occur. Consequently, threshold voltages of memory cells included in the unselected memory block may be maintained, and the reliability of the semiconductor memory device may be improved.

Figure 14:
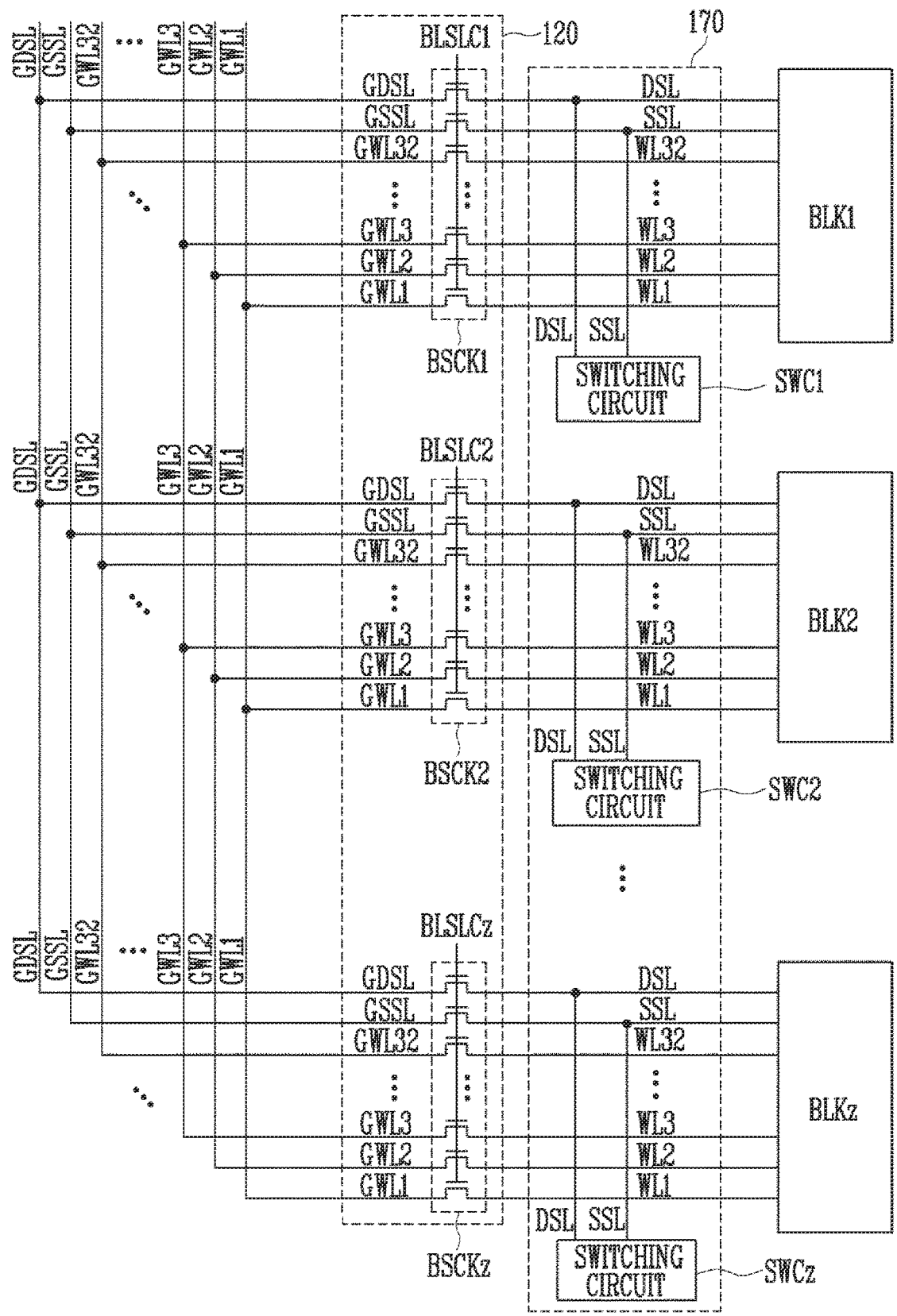
FIG. 14 is a block diagram illustrating an address decoder and a switch of a semiconductor memory device according to another embodiment of the present disclosure.

FIG. 14 is a block diagram illustrating an address decoder 120 and a switch 170 of a semiconductor memory device according to another embodiment of the present disclosure. The address decoder 120 and the switch 170 are connected to the memory block BLK1' having the structure shown in FIG. 12.

Referring to FIG. 14, global lines GL may include a global drain select line GDSL, a global source select line GSSL, global word lines GWL1 to GWL32, and a global pipe line GPL. Voltages having various levels, which are generated by the voltage generator 150, may be transferred to the global lines GL. Unlike the embodiment shown in FIG. 6, the global pipe line GPL is not illustrated. Description of elements and features common to those of FIG. 6 are omitted.

The address decoder 120 may transfer voltages applied to the global lines GL to local lines DSL, SSL, and WL1 to WL32 of a selected memory block in response to a block select signal BLSLC1 to BLSLCz.

Specifically, each of the block select circuits BSCK1 to BSCKz included in the address decoder 120 may connect the global lines GL and the local lines DSL, SSL, and WL1 to WL32 in response to the block select signal BLSLC1 to BLSLCz such that voltages applied to the global lines GL may be transferred to the local lines DSL, SSL, and WL1 to WL32.

For example, when z (where z is a positive integer) memory blocks are included in the memory cell array 110, the address decoder 120 may include z block select circuits BSCK1 to BSCKz. In an erase operation, a block select circuit connected to a selected memory block to be erased may be turned on, so that the global lines GL and the local lines DSL, SSL, and WL1 to WL32 may be connected. A block select circuit connected to an unselected memory block not to be erased may be turned off.

When a memory block BLK1 to BLKz corresponding to each of the switching circuits SWC1 to SWCz is an unselected memory block, the switching circuit may precharge non-memory lines, i.e., a drain select line DSL and a source select line SSL, which are connected to the unselected memory block, during a precharge period before an erase voltage is applied. To this end, each of the switching circuits SWC1 to SWCz may be connected to the drain select line DSL and the source select line SSL, which are connected to the corresponding memory block BLK1 to BLKz.

Figure 15:
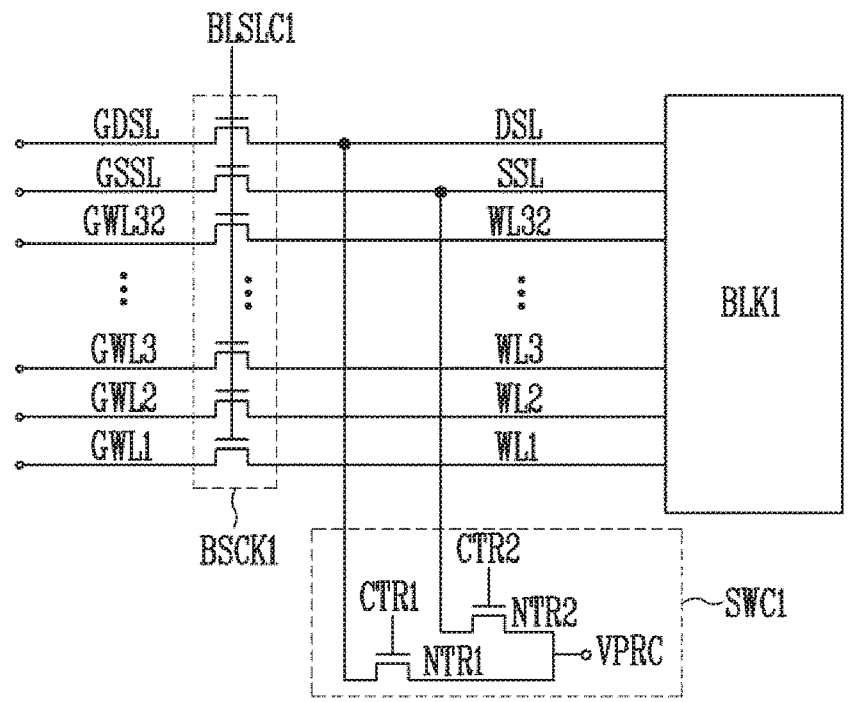
FIG. 15 is a block diagram illustrating a switching circuit of a semiconductor memory device according to another embodiment of the present disclosure.

FIG. 15 is a block diagram illustrating an example of a switching circuit of a semiconductor memory device according to another embodiment of the present disclosure, for example, the switching circuit SWC1 of the semiconductor memory device in FIG. 14.

Referring to FIG. 15, by way of example, it is illustrated that the switching circuit SWC1 and a block select circuit BSCK1 are connected to one memory block BLK1. A detailed configuration of the block select circuit BSCK is the same as described in FIG. 14. The switching circuit SWC1 may include NMOS transistors NTR1 and NTR2 respectively connected to the drain select line DSL and the source select line SSL. A first NMOS transistor NTR1 may be connected between the drain select line DSL and a precharge power source VPRC. A second NMOS transistor NTR2 may be connected between the source select line SSL and the precharge power source VPRC.

The precharge power source VPRC may supply a positive voltage, and supply a voltage for precharging the non-memory lines, i.e., the drain select line DSL and the source select line SSL.

First and second control signals CTR1 and CTR2 may be applied to gate terminals of the first and second NMOS transistors NTR1 and NTR2, respectively. The first and second NMOS transistors NTR1 and NTR2 may be turned on or turned off according to the first and second control signals CTR1 and CTR2, respectively. When the first and second NMOS transistors NTR1 and NTR2 are turned on, the drain select line DSL and the source select line SSL may be connected to the precharge power source VPRC. When the first and second NMOS transistors NTR1 and NTR2 are turned off, the drain select line DSL and the source select line SSL may not be connected to the precharge power source VPRC.

As compared with the switching circuit shown in FIG. 7, the switching circuit of FIG. 15 does not include the third NMOS transistor NTR3. This is because the pipe line PL is not connected to the memory block. Except the global pipe line GPL, the pipe line PL, and the pipe transistor PT, the switching circuit shown in FIG. 15 and the semiconductor memory device including the same may operate according to the timing diagram shown in FIG. 8 or 9.

Figure 16:
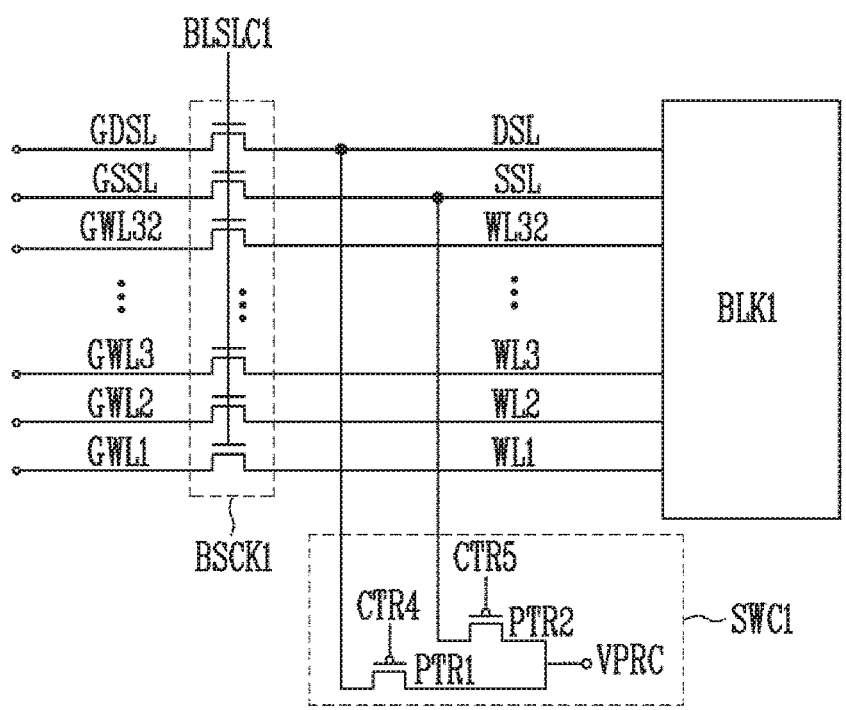
FIG. 16 is a block diagram illustrating a switching circuit of a semiconductor memory device according to another embodiment of the present disclosure.

FIG. 16 is a block diagram illustrating a switching circuit of a semiconductor memory device according to another embodiment of the present disclosure, for example, the switching circuit SWC1 of the semiconductor memory device in FIG. 14.

Referring to FIG. 16, by way of example, it is illustrated that the switching circuit SWC1 and a block select circuit BLCK1 are connected to one memory block BLK1. A detailed configuration of the block select circuit BLCK is the same as described in FIG. 14. The switching circuit SWC1 may include PMOS transistors PTR1 and PTR2 respectively connected to the drain select line DSL and the source select line SSL. A first PMOS transistor PTR1 may be connected between the drain select line DSL and a precharge power source VPRC. A second PMOS transistor PTR2 may be connected between the source select line SSL and the precharge power source VPRC. The precharge power source VPRC may supply a positive voltage, and supply a voltage for precharging the non-memory lines, i.e., the drain select line DSL and the source select line SSL.

Fourth and fifth control signals CTR4 and CTR5 may be applied to gate terminals of the first and second PMOS transistors PTR1 and PTR2, respectively. The first and second PMOS transistors PTR1 and PTR2 may be turned on or turned off according to the fourth and fifth control signals CTR4 and CTR5, respectively. When the first and second PMOS transistors PTR1 and PTR2 are turned on, the drain select line DSL and the source select line SSL may be connected to the precharge power source VPRC. When the first and second PMOS transistors PTR1 and PTR2 are turned off, the drain select line DSL and the source select line SSL may be not connected to the precharge power source VPRC.

As compared with the switching circuit shown in FIG. 10, the switching circuit of FIG. 16 does not include the third PMOS transistor PTR3. This is because the pipe line PL is not connected to the memory block. Except the global pipe line GPL, the pipe line PL, and the pipe transistor PT, the switching circuit shown in FIG. 16 and the semiconductor memory device including the same may operate according to the timing diagram shown in FIG. 11.

Figure 17:
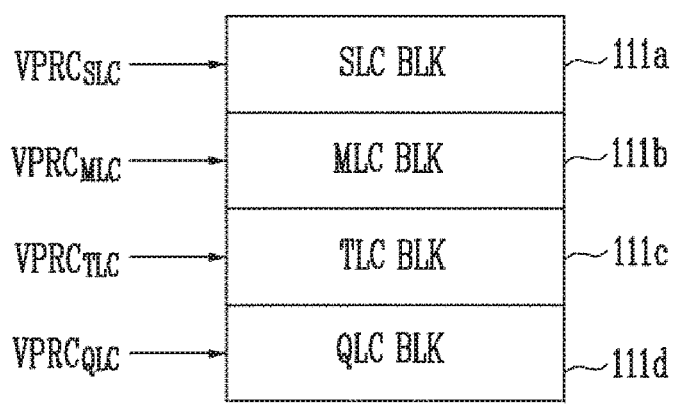
FIG. 17 is a diagram illustrating memory blocks operated in different ways.

FIG. 17 is a diagram illustrating memory blocks operated in different ways.

Referring to FIG. 17, the memory cell array 110 of the semiconductor memory device 100 shown in FIG. 1 may include memory blocks operated in different ways. For example, the memory blocks BLK1 to BLKz of the memory cell array 110 may include at least two different kinds of memory blocks among an SLC block 111a including memory cells operated as single-level cells (SLCs), an MLC block 111b including memory cells operated as multi-level cells (MLCs), a TLC block 111c including memory cells operated as triple-level cells (TLCs), and a QLC block 111d including memory cells operated as quad-level cells (QLCs).

For example, in an embodiment, the memory cell array 110 may include two different kinds of memory blocks among the SLC block 111a, the MLC block 111b, the TLC block 111c, and the QLC block 111d. In another embodiment, the memory cell array 110 may include three different kinds of memory blocks among the SLC block 111a, the MLC block 111b, the TLC block 111c, and the QLC block 111d. In still another embodiment, the memory cell array 110 may include all of the SLC block 111a, the MLC block 111b, the TLC block 111c, and the QLC block 111d.

When the memory cell array 110 includes at least two kinds of memory blocks operated in different ways, the precharge voltage of an unselected memory block in an erase operation may be changed depending on the kind of memory block.

For example, when any one memory block among the MLC block 111b, the TLC block 111c, and the QLC block 111d is erased, non-memory lines of the unselected SLC block 111a may be precharged by a precharge power source $VPRC_{SLC}$. When any one memory block among the SLC block 111a, the TLC block 111c, and the QLC block 111d is erased, non-memory lines of the unselected MLC block 111b may be precharged by a precharge power source $VPRC_{MLC}$. When any one memory block among the SLC block 111a, the MLC block 111b, and the QLC block 111d may be erased, non-memory lines of the unselected TLC block 111c may be precharged by a precharge power source $VPRC_{TLC}$. When any one memory block among the SLC block 111a, the MLC block 111b, and the TLC block 111c is erased, non-memory lines of the unselected QLC block 111d may be precharged by a precharge power source $VPRC_{QLC}$.

The precharge power sources $VPRC_{SLC}$, $VPR_{MLC}$, $VPRC_{TLC}$, and $VPRC_{QLC}$ may supply precharge voltages having different levels to the switching circuits SWC1, SWC2, . . . , and SWCz. Accordingly, in an erase operation of a selected memory block, the non-memory lines may be precharged with different voltage levels according to operation manners of unselected memory blocks.

Figure 18:
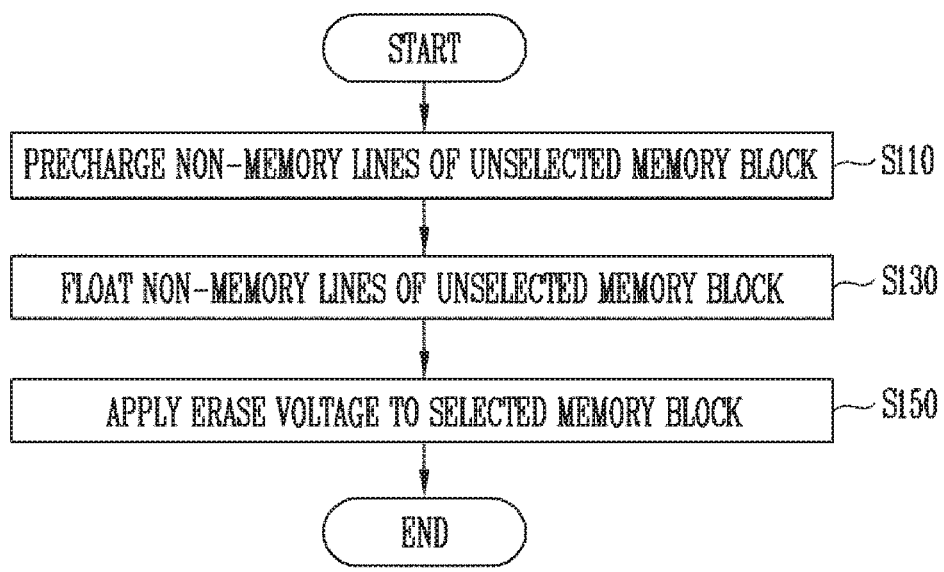
FIG. 18 is a flowchart illustrating an operating method of a semiconductor memory device according to an embodiment of the present disclosure.

FIG. 18 is a flowchart illustrating an operating method of a semiconductor memory device according to an embodiment of the present disclosure.

Referring to FIG. 18, at step S110, non-memory lines of an unselected memory block are precharged. As described above, a precharge operation corresponding to the step S110 may be performed in the precharge period PRECHARGE shown in FIGS. 8, 9, and 11.

At step S130, the non-memory lines of the unselected memory block are floated. As described above, the non-memory lines DSL, SSL, and PL of the unselected memory block may be floated at the time t3 shown in FIGS. 8, 9, and 11.

At step S150, an erase voltage is applied to a selected memory block. At the step S150, an erase bias may be applied to the bulk area in which the memory block is formed. Accordingly, the voltage of the non-memory lines connected to the unselected memory block may be increased due to the coupling phenomenon. Thus, it is less likely that the GIDL phenomenon will occur, and any hot hole is not generated. Consequently, threshold voltages of memory cells included in the unselected memory block may be maintained, and the reliability of the semiconductor memory device may be improved.

Figure 19:
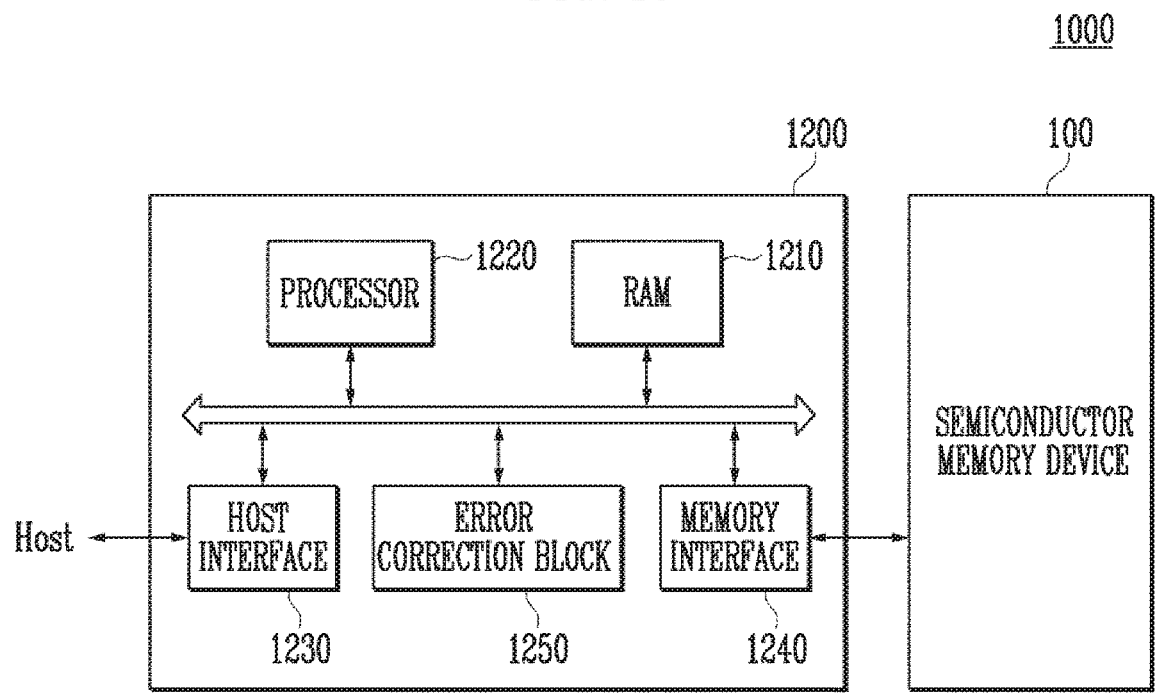
FIG. 19 is a block diagram illustrating a memory system including the semiconductor memory device of FIG. 1.

FIG. 19 is a block diagram illustrating a memory system 1000 including a semiconductor memory device, i.e., the semiconductor memory device 100 of FIG. 1.

Referring to FIG. 19, the memory system 1000 may include the semiconductor memory device 100 and a controller 1200.

The semiconductor memory device 100 may be configured and operated as described with reference to FIGS. 1 to 18.

The controller 1200 may be connected to a host (Host) and the semiconductor memory device 100. The controller 1200 is configured to access the semiconductor memory device 100 in response to a request from the host. For example, the controller 1200 is configured to control read, write, erase, and background operations of the semiconductor memory device 100. The controller 1200 is configured to provide an interface between the semiconductor memory device 100 and the host. The controller 1200 is configured to drive firmware for controlling the semiconductor memory device 100.

The controller 1200 may include a random access memory (RAM) 1210, a processor 1220, a host interface 1230, a memory interface 1240, and an error correction block 1250. The RAM 1210 may be used as at least one of a working memory of the processor 1220, a cache memory between the semiconductor memory device 100 and the host, and a buffer memory between the semiconductor memory device 100 and the host. The processor 1220 may control the overall operations of the controller 1200.

The host interface 1230 may include a protocol for exchanging data between the host and the controller 1200. As an embodiment, the controller 1200 is configured to communicate with the host through at least one of various interface protocols such as a Universal Serial Bus (USB) protocol, a Multi-Media Card (MMC) protocol, a Peripheral Component Interconnection (PCI) protocol, a PCI-Express (PCI-e or PCIe) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, an Integrated Drive Electronics (IDE) protocol, and a private protocol.

The memory interface 1240 may interface with the semiconductor memory device 100. For example, the memory interface 1240 may include a NAND interface or a NOR interface.

The error correction block 1250 is configured to detect and correct an error of data received from the semiconductor memory device 100 by using an Error Correction Code (ECC).

The controller 1200 and the semiconductor memory device 100 may be integrated into one semiconductor device. In an embodiment, the controller 1200 and the semiconductor memory device 100 may be so integrated to constitute a memory card such as a PC card (e.g., Personal Computer Memory Card International Association (PCM-CIA)), a Compact Flash (CF) card, a Smart Media Card (SM or SMC), a memory stick, a Multi-Media Card (e.g., MMC, RS-MMC or MMCmicro), an SD Card (e.g., SD, miniSD, microSD or SDHC), or a Universal Flash Storage (UFS).

The controller 1200 and the semiconductor memory device 100 may be integrated into one semiconductor device to constitute a semiconductor drive (e.g., Solid State Drive (SSD)). The semiconductor drive SSD may include a storage device configured to store data in a semiconductor memory. If the memory system 1000 is used as the semiconductor drive SSD, the operating speed of the host connected to the memory system 1000 may be remarkably improved.

As another example, the memory system 1000 may be provided as one of various components of an electronic device such as a computer, an ultra-mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), Ceramic Dual In-Line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 20:
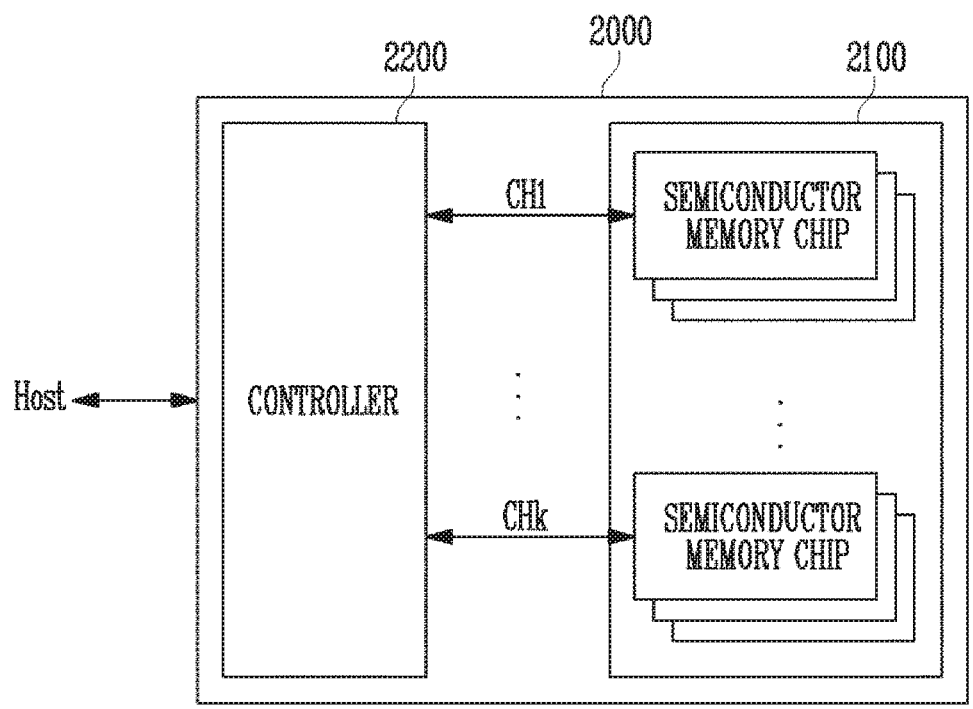
FIG. 20 is a block diagram illustrating an exemplary application of the memory system of FIG. 19.

FIG. 20 is a block diagram illustrating an exemplary application of a memory system 2000, which may be the memory system 1000 of FIG. 19.

Referring to FIG. 20, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

The plurality of groups may communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured and operated similarly to the controller 1200 described with reference to FIG. 19. The controller 2200 is configured to control the plurality of memory chips of the semiconductor memory device 2100 through the plurality of channels CH1 to CHk.

In FIG. 20, a plurality of semiconductor memory chips are connected to one channel. However, it will be understood that the memory system 2000 may be modified such that one semiconductor memory chip is connected to one channel.

Figure 21:
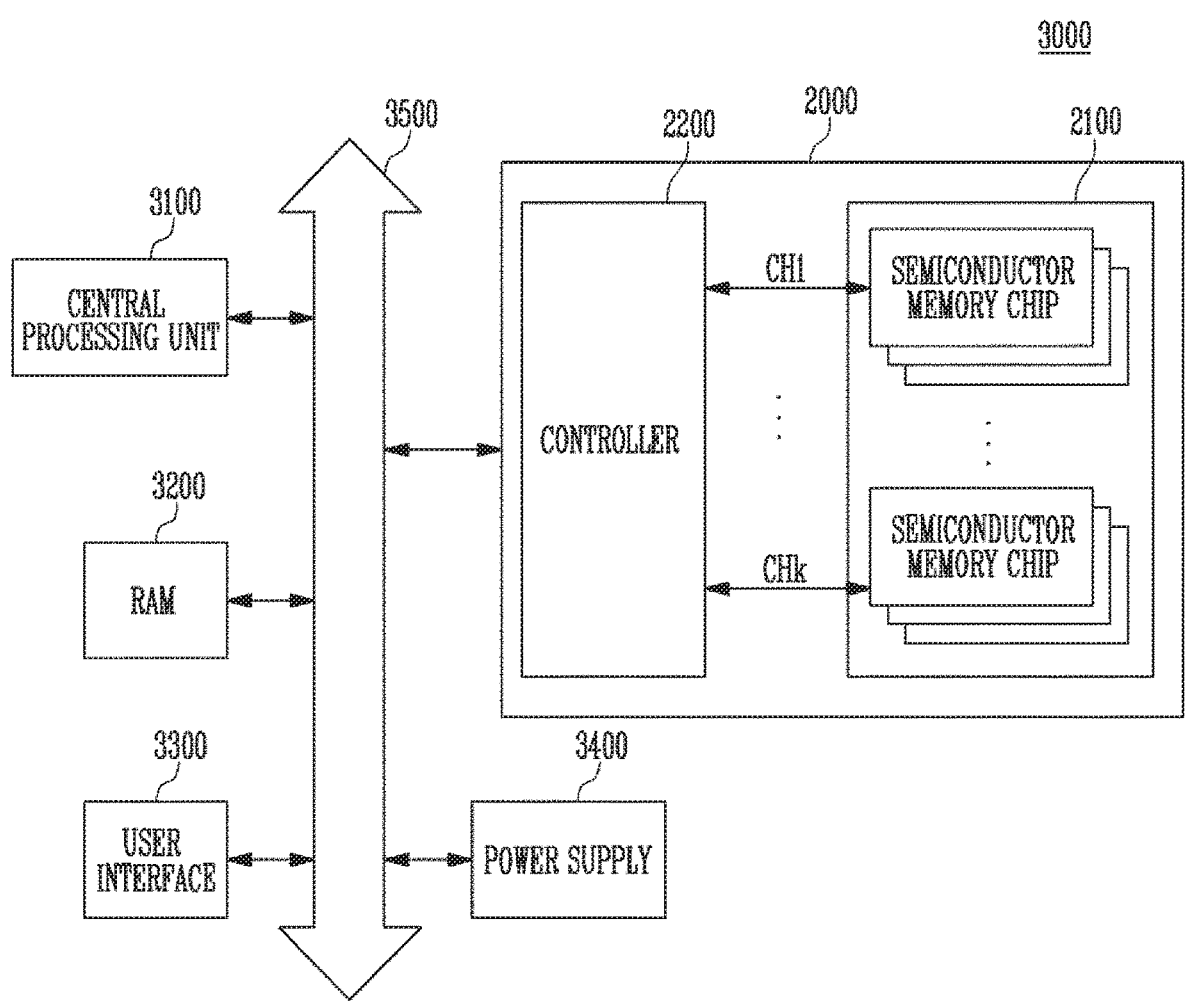
FIG. 21 is a block diagram illustrating a computing system including the memory system of FIG. 20.

FIG. 21 is a block diagram illustrating a computing system 3000 including the memory system 2000 described with reference to FIG. 20.

Referring to FIG. 21, the computing system 3000 may include a central processing unit (CPU) 3100, a random access memory (RAM) 3200, a user interface 3300, a power supply 3400, a system bus 3500, and the memory system 2000.

The memory system 2000 is electrically connected to the CPU 3100, the RAM 3200, the user interface 3300, and the power supply 3400 through the system bus 3500. Data supplied through the user interface 3300 or data processed by the CPU 3100 may be stored in the memory system 2000.

In FIG. 21 the semiconductor memory device 2100 is connected to the system bus 3500 through the controller 2200. However, the semiconductor memory device 2100 may be directly connected to the system bus 3500. The function of the controller 2200 may be performed by the CPU 3100 and the RAM 3200.

In FIG. 21 the memory system 2000 described with reference to FIG. 20. However, the memory system 2000 may be replaced by the memory system 1000 described with reference to FIG. 19. In an embodiment, the computing system 3000 may be configured to include both the memory systems 1000 and 2000 described with reference to FIGS. 19 and 20.

According to the present disclosure, a semiconductor memory device having improved reliability and an operating method of the semiconductor memory device are provided.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory blocks having a plurality of memory cells;
   an address decoder connected to the memory cell array through row lines, the row lines including word lines and non-memory lines, each of the word lines being coupled to a gate terminal of a corresponding memory cell among the plurality of memory cells, each of the non-memory lines being at least one of a drain select line and a source select line;
   a switch connected to the non-memory lines among the row lines; and
   a control logic configured to control operations of the address decoder and the switch,
   wherein, during an erase operation on memory cells in a selected memory block among the plurality of memory blocks, the control logic controls the switch to precharge non-memory lines connected to an unselected memory block among the plurality of memory blocks and then float the non-memory lines connected to the unselected memory block.

2. The semiconductor memory device of claim 1, wherein the control logic controls the address decoder to erase the selected memory block after the non-memory lines connected to the unselected memory block are floated.

3. The semiconductor memory device of claim 1, wherein the control logic controls the address decoder and the switch such that the non-memory lines are floated before the non-memory lines connected to the unselected memory block are precharged.

4. The semiconductor memory device of claim 1, wherein the non-memory lines further include a pipe line.

5. The semiconductor memory device of claim 1, wherein the address decoder includes a plurality of block select circuits each connected to a corresponding memory block among the plurality of memory blocks through the row lines,
   wherein the switch includes a plurality of switching circuits each connected to non-memory lines connected to a corresponding memory block among the plurality of memory blocks.

6. The semiconductor memory device of claim 5, wherein each of the plurality of block select circuits connects row lines connected to a corresponding memory block to global lines in response to a block select signal.

7. The semiconductor memory device of claim 6, wherein each of the switching circuits precharges corresponding non-memory lines by connecting the non-memory lines to a precharge power source in response to a control signal.

8. The semiconductor memory device of claim 7, wherein each of the plurality of switching circuits includes a first transistor connected between a corresponding drain select line and the precharge power source, a second transistor connected between a corresponding source select line and the precharge power source, and a third transistor connected between a corresponding pipe line and the precharge power source.

9. The semiconductor memory device of claim 8, wherein at least one of the first transistor, the second transistor, and the third transistor includes an NMOS transistor.

10. The semiconductor memory device of claim 8, wherein at least one of the first transistor, the second transistor, and the third transistor includes a PMOS transistor.

11. A method for operating a semiconductor memory device including a plurality of memory blocks, each of the plurality of memory blocks being coupled to row lines, the row lines including word lines and non-memory lines, each of the word lines being coupled to a gate terminal of a corresponding memory cell among the plurality of memory cells, each of the non-memory lines being at least one of a drain select line and a source select line, the method comprising:
   precharging non-memory lines of an unselected memory block among the plurality of memory blocks;
   floating the non-memory lines of the unselected memory block; and
   applying an erase voltage to a selected memory block among the plurality of memory blocks.

12. The method of claim 11, wherein the precharging of the non-memory lines of the unselected memory block comprises:
   turning off a block select circuit connected to the unselected memory block; and
   connecting the non-memory lines of the unselected memory block to a precharge power source by turning on a switching circuit connected to the non-memory lines of the unselected memory block.

13. The method of claim 12, wherein the floating of the non-memory lines of the unselected memory block comprises:
   maintaining a turn-off state of the block select circuit connected to the unselected memory block, and
   turning off the switching circuit connected to the non-memory lines of the unselected memory block.

14. The method of claim 13, wherein the applying of the erase voltage to the selected memory block among the plurality of memory blocks comprises:

applying an erase permission voltage to a word line connected to the selected memory block, and applying the erase voltage to a bulk area in which the selected memory block is formed.

15. The method of claim 11, wherein the precharging of the non-memory lines of the unselected memory block includes connecting the non-memory lines of the unselected memory block to global non-memory lines by turning on a block select circuit connected to the unselected memory block.

16. The method of claim 15, wherein the floating of the non-memory lines of the unselected memory block includes cutting off connection between the non-memory lines of the unselected memory block and the global non-memory lines by turning off the block select circuit connected to the unselected memory block.

17. A semiconductor memory device comprising:
a memory cell array including a plurality of memory blocks;
an address decoder configured to select at least one of the plurality of memory blocks;
a plurality of row lines coupled between the address decoder and the plurality of memory blocks, the row lines including word lines and non-memory lines, each of the word lines being coupled to a gate terminal of a corresponding memory cell among a plurality of memory cells of the plurality of memory blocks, each of the non-memory lines being at least one of a drain select line and a source select line coupled to the plurality of memory blocks;
a switch configured to selectively couple the plurality of row lines to a power source; and
a control logic configured to control the switch such that the non-memory lines connected to at least one unselected memory block are coupled to the power source to be precharged, and then floated.

18. The semiconductor memory device of claim 17, wherein, during an erase operation on memory cells included in a selected memory block among the plurality of memory blocks, the control logic controls the switch such that the non-memory lines connected to the selected memory block are coupled to the power source.

\* \* \* \* \*